(12) United States Patent
Funaki et al.

(10) Patent No.: US 12,002,760 B2
(45) Date of Patent: Jun. 4, 2024

(54) COMPOSITE COMPONENT AND METHOD FOR MANUFACTURING THE SAME

(71) Applicant: Murata Manufacturing Co., Ltd., Nagaokakyo (JP)

(72) Inventors: Tatsuya Funaki, Nagaokakyo (JP); Shunsuke Abe, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 303 days.

(21) Appl. No.: 17/490,424

(22) Filed: Sep. 30, 2021

(65) Prior Publication Data

US 2022/0020692 A1    Jan. 20, 2022

Related U.S. Application Data

(63) Continuation of application No. PCT/JP2020/022841, filed on Jun. 10, 2020.

(30) Foreign Application Priority Data

Jun. 25, 2019   (JP) .................................. 2019-117035

(51) Int. Cl.

| H01L 23/538 | (2006.01) |
| H01L 21/48 | (2006.01) |
| H01L 21/56 | (2006.01) |
| H01L 23/29 | (2006.01) |
| H01L 23/31 | (2006.01) |

(52) U.S. Cl.
CPC ........ H01L 23/5382 (2013.01); H01L 21/485 (2013.01); H01L 21/4853 (2013.01);
(Continued)

(58) Field of Classification Search
CPC ............... H01L 23/5382; H01L 21/485; H01L 21/4853; H01L 21/486; H01L 21/565;
(Continued)

(56) References Cited

U.S. PATENT DOCUMENTS

| 2005/0087853 A1 | 4/2005 | Okumura et al. |
| 2011/0080713 A1 | 4/2011 | Sunohara |

(Continued)

FOREIGN PATENT DOCUMENTS

| JP | 2005012180 A | 1/2005 |
| JP | 2011082293 A | 4/2011 |

(Continued)

OTHER PUBLICATIONS

Written Opinion of the International Searching Authority issued for PCT/JP2020/022841, dated Sep. 8, 2020.

(Continued)

*Primary Examiner* — Evan G Clinton
(74) *Attorney, Agent, or Firm* — ArentFox Schiff LLP

(57) ABSTRACT

A composite component that includes an interposer structure and an electronic component. The interposer structure includes a Si base layer having a first main surface and a second main surface facing each other, a rewiring layer on the first main surface, a through Si via electrically connected to the rewiring layer and penetrating the Si base layer, an interposer electrode facing the second main surface, and an adhesive layer. The electronic component has a surface and a component electrode on the surface and connected to the through Si via, and is located between the interposer electrode and the Si base layer such that the component electrode and the surface are adhered to the second main surface of the Si base layer with the adhesive layer interposed therebetween. The through Si via extends from the second main surface, penetrates the adhesive layer, and is electrically connected to the component electrode.

11 Claims, 14 Drawing Sheets

(52) U.S. Cl.
CPC .......... *H01L 21/486* (2013.01); *H01L 21/565* (2013.01); *H01L 23/295* (2013.01); *H01L 23/3121* (2013.01); *H01L 23/5384* (2013.01); *H01L 23/5386* (2013.01)

(58) Field of Classification Search
CPC ............... H01L 23/295; H01L 23/3121; H01L 23/5384; H01L 23/5386; H01L 21/4857; H01L 23/147; H01L 23/49822; H01L 25/065; H01L 25/07; H01L 25/18; H01L 21/76898; H01L 23/3128; H01L 23/481; H05K 1/02; H05K 1/18
See application file for complete search history.

(56) References Cited

U.S. PATENT DOCUMENTS

| | | | | |
|---|---|---|---|---|
| 2015/0243583 A1* | 8/2015 | Li | .................. | H01L 23/481 |
| | | | | 257/774 |
| 2015/0340327 A1* | 11/2015 | Uzoh | ................ | H01L 21/76898 |
| | | | | 438/109 |
| 2018/0301376 A1* | 10/2018 | Shih | .................. | H01L 24/97 |
| 2020/0303335 A1* | 9/2020 | Chu | .................. | H01L 24/20 |

FOREIGN PATENT DOCUMENTS

| | | |
|---|---|---|
| JP | 2016004795 A | 1/2016 |
| JP | 2020092147 A | 6/2020 |

OTHER PUBLICATIONS

International Search Report issued for PCT/JP2020/022841, dated Sep. 8, 2020.

Lin, Larry et al.; "Reliability Characterization of Chip-on-Wafer-on-Substrate (CoWoS) 3D IC Integration Technology"; 2013 Electronic Components & Technology Conference Papers, pp. 366-371.

* cited by examiner

FIG. 7 - PRIOR ART
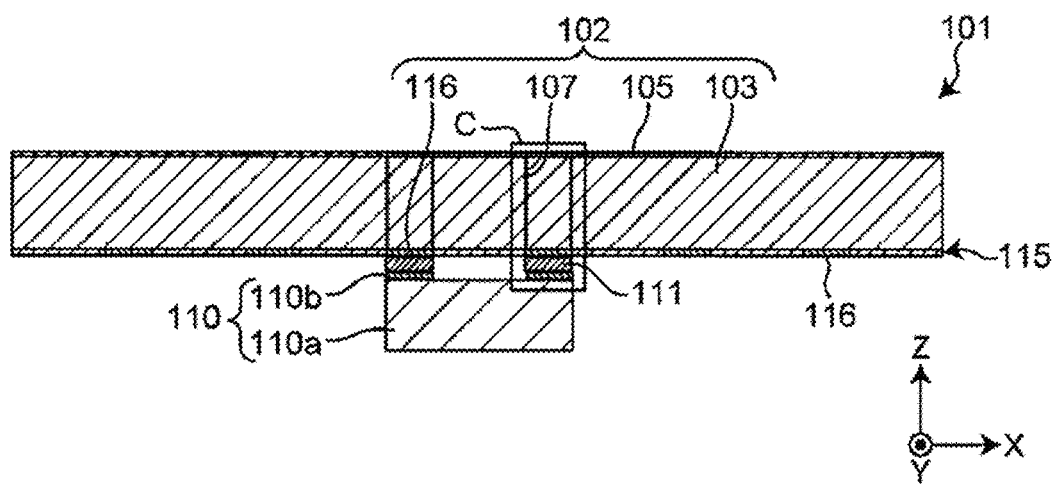
FIG. 8 - PRIOR ART
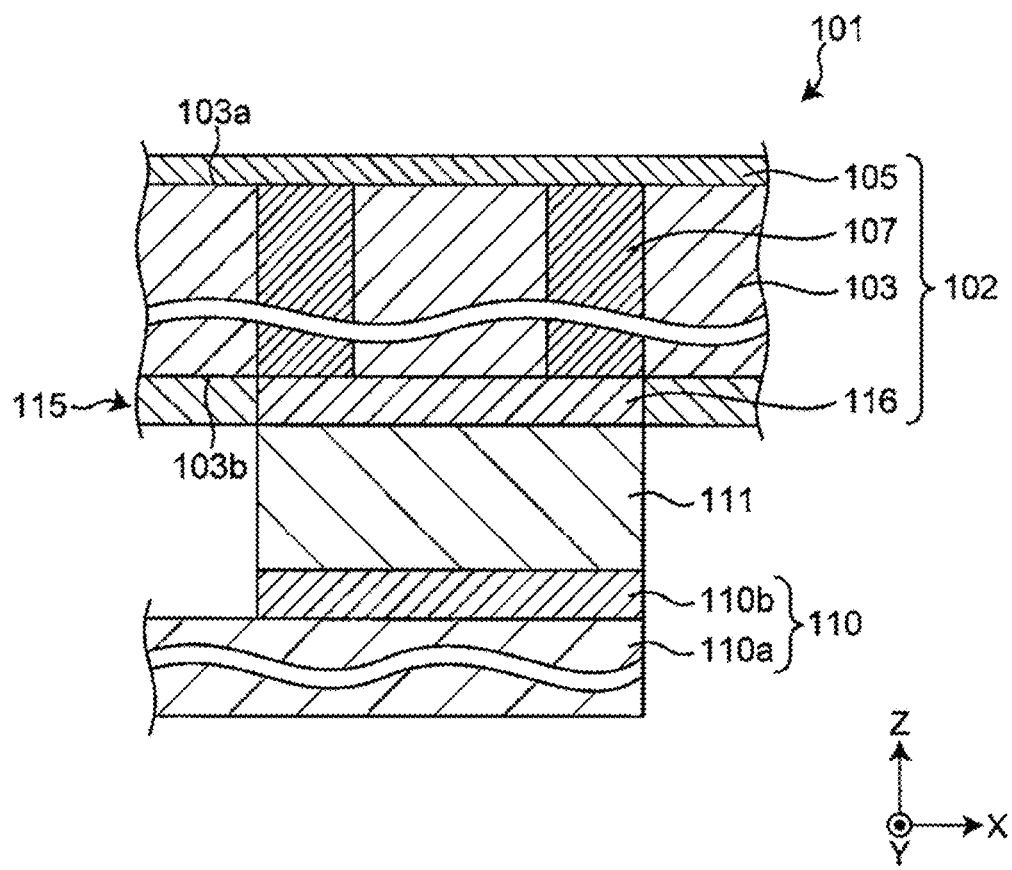

COMPOSITE COMPONENT AND METHOD FOR MANUFACTURING THE SAME

CROSS REFERENCE TO RELATED APPLICATIONS

The present application is a continuation of International application No. PCT/JP2020/022841, filed Jun. 10, 2020, which claims priority to Japanese Patent Application No. 2019-117035, filed Jun. 25, 2019, the entire contents of each of which are incorporated herein by reference.

FIELD OF THE INVENTION

The present invention relates to a composite component and a method for manufacturing the same.

BACKGROUND OF THE INVENTION

Electronic components are mounted on a motherboard via an interposer (board). The interposer is described, for example, in FIG. 7 in 2013 Electronic Components & Technology Conference Papers (Non-Patent Document 1).

Non-Patent Document 1: Larry Lin et al. "Reliability Characterization of Chip-on-Wafer-on-Substrate (CoWOS) 3D IC Integration Technology", 2013 Electronic Components & Technology Conference Papers, pp 366-371

SUMMARY OF THE INVENTION

Meanwhile, it has been found that this interposer has the following problems. That is, a length (wiring length) of a via wiring from a rewiring layer to a component electrode of an electronic component becomes relatively long. As a result, for example, there is a problem that parasitic impedance due to via wiring becomes relatively large, and electrical characteristics of an electronic device using a composite component including an interposer deteriorate.

Therefore, an object of the present disclosure is to provide a composite component that reduces parasitic impedance due to a wiring and improves electrical characteristics of an electronic device using the composite component.

The present inventor has conducted intensive studies in order to solve the above problems, and have found that a wiring length can be shortened by disposing an electronic component between an interposer electrode and a Si base layer, which are components of an interposer, and connecting through Si vias (TSVs) penetrating the Si base layer to a component electrode of the electronic component, thereby completing the present disclosure for reducing parasitic impedance. That is, the present disclosure includes the following embodiments.

In order to solve the problem, a composite component according to an aspect of the present disclosure includes: an interposer structure that includes a Si base layer having a first main surface and a second main surface facing each other, a rewiring layer on the first main surface, a through Si via electrically connected to the rewiring layer and penetrating the Si base layer, an interposer electrode facing the second main surface, and an adhesive layer; and an electronic component having a surface and a component electrode on the surface and connected to the through Si via, the electronic component located between the interposer electrode and the Si base layer, wherein the component electrode and the surface of the electronic component are adhered to the second main surface of the Si base layer with the adhesive layer interposed therebetween, and the through Si via includes a through Si via main body and an extending portion extending from the second main surface, penetrating the adhesive layer, and electrically connected to the component electrode.

According to the aspect, the electronic component is provided between the interposer electrode and the Si base layer, and the through Si via has the extending portion extending from the second main surface and electrically connected to the electronic component. With such a configuration, a wiring length for connecting the electronic components can be shortened as compared with the case in the related art, and the parasitic impedance can be reduced. Thus, the electronic characteristics of the electronic device using the composite component according to the aspect are improved. Furthermore, a thickness of the composite component can be reduced, and the composite component can be downsized and thinned.

Also, in one embodiment of the composite component, only the through Si via electrically connects the component electrode to the rewiring layer.

According to the embodiment, since the through Si via does not have a solder bump, the parasitic impedance due to the wiring can be further reduced. Thus, the electronic characteristics of the electronic device using the composite component according to the aspect are improved. Furthermore, since the wiring length can be shortened, the thickness of the composite component can be reduced, and the composite component can be downsized and thinned.

Also, in one embodiment of the composite component, a length of the Si via is 3 µm to 46 µm.

According to the embodiment, when the length of the Si via is in the above range, the length is shorter than the length (for example, about 100 µm) of the wiring in the related art, so that the parasitic impedance due to the wiring can be further reduced. Thus, the electronic characteristics of the electronic device using the composite component according to the aspect are improved. Furthermore, since the Si via length can be shortened, the thickness of the composite component can be reduced, and the composite component can be downsized and thinned.

Also, in one embodiment of the composite component, the composite component further includes a conductive pillar that electrically connects the through Si via and the component electrode, in which a via wiring electrically connected from the component electrode to the rewiring layer is configured to include the through Si via and the conductive pillar, and the conductive pillar is configured to include a conductive material which is the same as a conductive material constituting the through Si via.

According to the embodiment, the conductive pillar is configured to include a conductive material which is the same as a conductive material constituting the through Si via. By electrically connecting the through Si via to the component electrode via such a conductive pillar, connection resistance (contact resistance) between the through Si via and the component electrode can be reduced. This improves the electrical characteristics of the electronic device using the composite component.

Also, in one embodiment of the composite component, the adhesive layer has a thickness of 26 µm or less.

According to the embodiment, by setting the thickness of the adhesive layer within the above range, the thickness of the composite component is reduced. As a result, the electronic component using the composite component can be downsized and thinned.

Also, in one embodiment of the composite component, a sectional shape of the component electrode in a plane orthogonal to a stacking direction of the composite component is substantially rectangular, a sectional shape of the through Si via in the plane is substantially circular, and a diameter φ of the through Si via satisfies the following expression (1):

$$T(Si)+(T(A)-H(C))/3 \leq \varphi \leq r \tag{1}$$

In Expression (1), T(Si) is a thickness of the Si base layer, T(A) is a thickness of the adhesive layer, H(C) is a height of the component electrode, and r is a diameter of a circle inscribed in the sectional shape of the component electrode at an interface between the through Si via and the component electrode.

According to the embodiment, when the diameter φ of the through Si via satisfies Expression (1), the diameter φ of the through Si via increases, so that the parasitic impedance of the through Si via is reduced and the electrical characteristics of the electronic device using the composite component are improved.

Also, in one embodiment of the composite component, two or more of the through Si vias are electrically connected to one component electrode.

According to the embodiment, since two or more through Si vias are electrically connected to one component electrode, the parasitic impedance between the rewiring layer and the electronic component is reduced, and the electrical characteristics of the electronic device using the interposer are improved.

Also, in one embodiment of the composite component, the composite component further includes a resin that seals and integrates the electronic component.

According to the embodiment, since the electronic component can be integrated with the resin, although an electronic component (more specifically, a general-purpose electronic component) of which a dimension does not match that of the Si base layer can be mounted. Accordingly, a low-cost and high-performance electronic component can be used. In addition, design with a high degree of freedom becomes possible, and the electronic components can be combined according to applications.

Also, in one embodiment of the composite component, the resin is an epoxy resin, and the resin further contains a $SiO_2$ filler dispersed in the resin.

According to the embodiment, since the resin for integrating the electronic components is the epoxy resin and further includes a $SiO_2$ filler, a linear expansion coefficient of the layer (electronic component layer) obtained by integrating the electronic components with the resin can be brought close to a linear expansion coefficient of the Si base layer. This can reduce warpage of the composite component during manufacturing of the composite component and improve reliability of the composite component.

Also, in one embodiment of the composite component, the composite component further includes a first insulating film between the through Si via and the Si base layer and a second insulating film between the adhesive layer and the Si base layer, and a thickness of the second insulating film is less than a thickness of the first insulating film.

According to the embodiment, since the thickness of the second insulating film is less than the thickness of the first insulating film, a diameter of the through Si via in the adhesive layer becomes larger. As a result, the parasitic impedance of the through Si via is reduced, and the electrical characteristics of the electronic device using the composite component are improved.

Further, in an embodiment of the composite component, a maximum diameter of the extending portion is larger than a minimum diameter of the through Si via main body.

According to the embodiment, since the maximum diameter of the extending portion is larger than the minimum diameter of the through Si via main body, the parasitic impedance of the through Si via is reduced, and the electrical characteristics of the electronic device using the composite component are improved.

Further, in an embodiment of the composite component, a maximum diameter of the extending portion is larger than a maximum diameter of the through Si via main body.

According to the embodiment, since the maximum diameter of the extending portion is larger than the maximum diameter of the through Si via main body, the parasitic impedance of the through Si via is reduced, and the electrical characteristics of the electronic device using the composite component are improved.

A method for manufacturing a composite component according to an aspect of the present disclosure includes: forming an adhesive layer on a Si base layer; adhering an electronic component onto the Si base layer with the adhesive layer interposed therebetween; bonding a Si support on the electronic component; thinning the Si base layer; forming a through hole in the thinned Si base layer and the adhesive layer to expose a component electrode of the electronic component; and forming a through Si via in the through hole by electrolytic plating.

According to the embodiment, since the Si base layer is supported by the Si support and thinned, the Si base layer can be thinned. In addition, the through Si via electrically connected to the component electrode of the electronic component can be produced. As a result, it is possible to manufacture a composite component having a shorter wiring length and reduced parasitic impedance as compared with the related art.

Further, according to another aspect of the present disclosure, a method for manufacturing a composite component includes: forming an adhesive layer on a Si base layer; adhering an electronic component on the Si base layer with the adhesive layer interposed therebetween; sealing the electronic component with a resin to form an integrated electronic component layer; bonding a Si support on the electronic component layer; thinning the Si base layer; forming a through hole in the thinned Si base layer and the adhesive layer to expose a component electrode of the electronic component; and forming a through Si via in the through hole by electrolytic plating.

According to the embodiment, since the Si base layer is supported by the Si support and thinned, the Si base layer can be thinned. In addition, the through Si via electrically connected to the component electrode of the electronic component can be produced. As a result, it is possible to manufacture a composite component having a shorter wiring length and reduced parasitic impedance as compared with the related art.

According to the composite component as one aspect of the present disclosure, it is possible to reduce parasitic impedance due to wiring and improve electrical characteristics of an electronic device using the composite component.

BRIEF EXPLANATION OF THE DRAWINGS

FIG. 7 is a sectional view illustrating a composite component in which a part of a composite component in the related art is replaced.

FIG. 8 is an enlarged view of a portion C in FIG. 7.

DETAILED DESCRIPTION OF THE INVENTION

Hereinafter, a composite component which is one aspect of the present disclosure will be described in detail with reference to the illustrated embodiment. Note that the drawings include some schematic drawings, and may not reflect actual dimensions and ratios. In addition, the dimensions (more specifically, thickness, diameter, and the like) of the components in the composite component were measured based on SEM images taken with a scanning electron microscope.

First Embodiment (Configuration)

Figure 1:
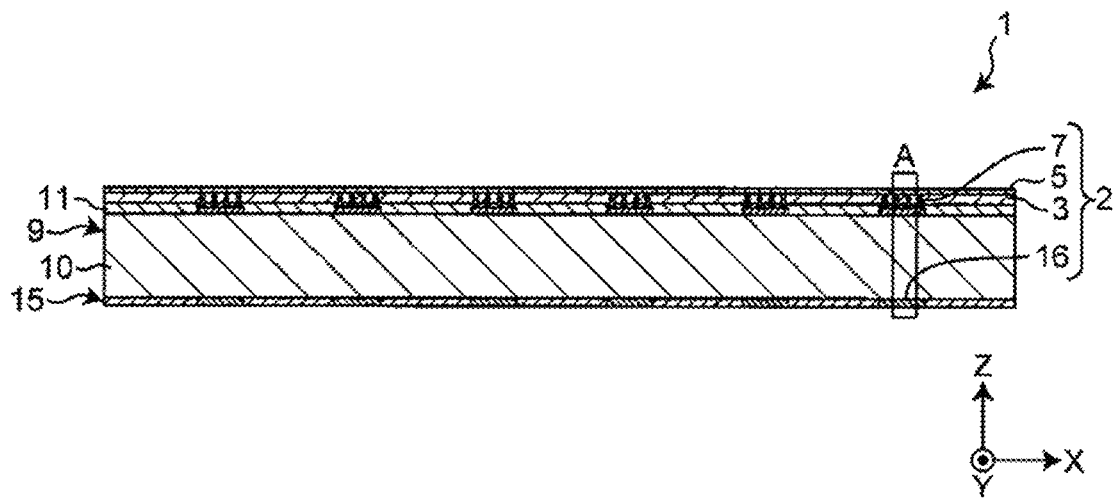
FIG. 1 is a sectional view illustrating a first embodiment of a composite component.
Figure 2:
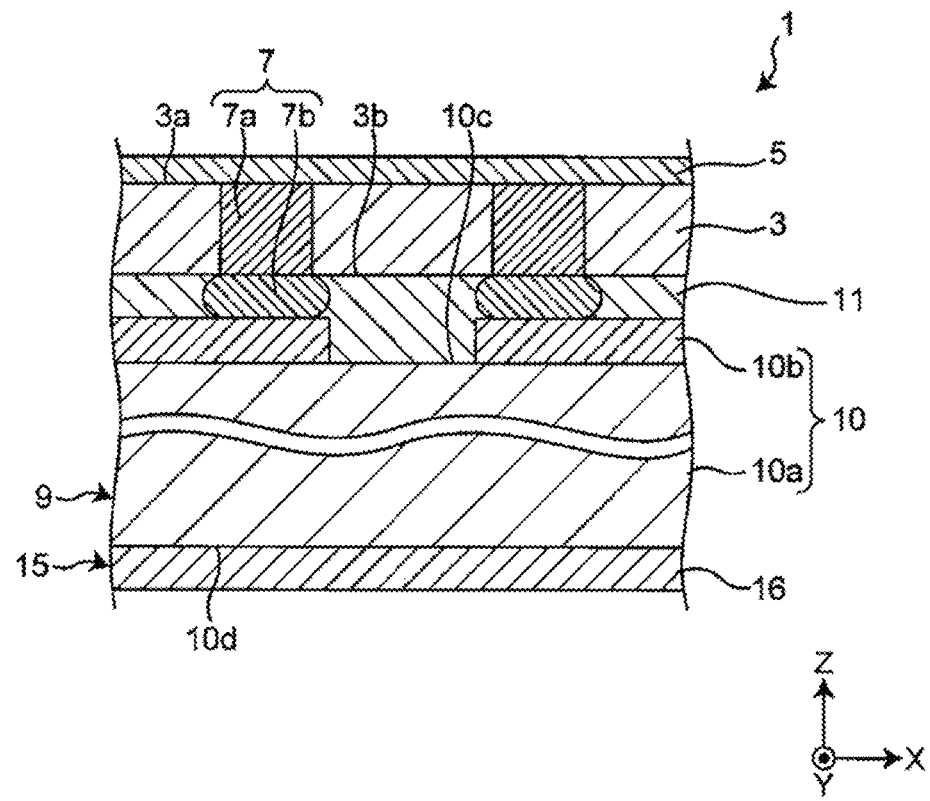
FIG. 2 is an enlarged view of a portion A in FIG. 1.

FIG. 1 is a view schematically illustrating a section of a composite component 1 according to a first embodiment of the present disclosure. FIG. 2 is an enlarged view of a portion A in FIG. 1.

As illustrated in FIGS. 1 and 2, the composite component 1 includes an interposer structure 2 and an electronic component 10. In the drawing, a direction parallel to a thickness of the composite component 1 is defined as a Z direction, a forward Z direction is defined as an upper side, and an opposite Z direction is defined as a lower side. In a plane orthogonal to the Z direction of the composite component 1, a direction parallel to a paper surface on which the drawings are described is defined as an X direction, and a direction orthogonal to the paper surface on which the drawings are described is defined as a Y direction.

In the composite component 1 according to the present embodiment, the interposer structure 2 includes a Si base layer 3 having a first main surface 3a and a second main surface 3b facing each other, a rewiring layer 5 formed on the first main surface 3a, a through Si via 7 electrically connected to the rewiring layer 5 and penetrating the Si base layer 3, an interposer electrode 16 facing the second main surface 3b, and an adhesive layer 11. The electronic component 10 includes a component electrode 10b connected to the through Si via 7, and provided between the interposer electrode 16 and the Si base layer 3. In the electronic component 10, the component electrode 10b and the surface (third main surface 10c) on which the component electrode 10b is formed are adhered to the Si base layer 3 with the adhesive layer 11 interposed therebetween. The through Si via 7 has a through Si via main body 7a and an extending portion 7b that extends from the second main surface 3b, penetrates the adhesive layer 11, and is electrically connected to the component electrode 10b.

As described above, in the composite component 1 according to the present embodiment, since the length of the via wiring from the rewiring layer 5 to the component electrode 10b is shorter than that in the related art (for example, about 100 μm), the parasitic impedance due to the via wiring can be reduced, and the electrical characteristics of the electronic device using the composite component 1 can be improved. Examples of such a decrease in the electrical characteristics include, in a semiconductor element IC mounted on the rewiring layer, a decrease in a function of suppressing power supply voltage fluctuation with respect to a semiconductor element IC driven at a high speed, and a decrease in a function of absorbing a high-frequency ripple.

The composite component 1 can be configured integrally with a package board (not illustrated) to be modularized as necessary, for example. For example, the composite component 1 is fixed on the package board using solder bumps to be modularized with the package board. Thus, a module product such as a semiconductor package can be manufactured. As illustrated in FIG. 1, the composite component 1 fixes the electronic component 10 inside the interposer structure 2. That is, the composite component 1 is an electronic component built-in type composite component. In the composite component 1, an interposer electrode layer 15 having the interposer electrode 16 forming a solder bump is planar. Therefore, a large number of solder bumps can be arranged.

On the other hand, in a composite component 101 (refer to FIGS. 7 and 8) of a comparative example to be described later, an electronic component 110 is mounted on the surface of an interposer structure 102. That is, the composite component 101 is an electronic component surface mount type composite component. Specifically, the electronic component 110 is disposed on the installation surface of an interposer electrode 116 in the interposer structure 102. Therefore, when the composite component 101 is integrated with the package board, the electronic component 110 occupies a part of the space on the interposer electrode layer 115. Therefore, a large number of solder bumps cannot be arranged.

Therefore, the composite component 1 can be strongly fixed on the package board as compared with the composite component 101.

(Electronic Component and Electronic Component Layer)

The electronic component 10 includes a third main surface 10c, a fourth main surface 10d, which face each other, and a component electrode 10b disposed on the third main surface 10c. The electronic component 10 is, for example, an electronic component in which one or more elements are integrated in a substance similar to the substance constituting the Si base layer 3. The electronic components 10 are, for example, active components (more specifically, CPU, GPU, LSI, and the like) and passive components (more specifically, a capacitor, a resistor, an inductor, and the like). The electronic component 10 constitutes an electronic component layer 9 by the electronic component 10 alone. That is, in the first embodiment, the electronic component layer 9 is made of the electronic component 10. The dimensions of the electronic component 10 in the X direction and the Y direction are substantially the same as the dimensions of the Si base layer 3 in the X direction and the Y direction, respectively.

The electronic component 10 is provided between the interposer electrode 16 and the Si base layer 3. In the electronic component 10, the component electrode 10b and the surface on which the component electrode 10b is formed are adhered to the Si base layer 3 with the adhesive layer 11 interposed therebetween.

By being electrically connected to the interposer electrode 16, another electronic component can be stacked and mounted on the electronic component layer 9 in the composite component 1. In FIGS. 1 and 2, one electronic component 10 is fixed inside the interposer structure 2 as the electronic component layer 9, but two or more electronic components may be provided by stacking another electronic component on the electronic component layer 9. The two or more electronic components may be of the same type or different types.

The component electrode 10b is directly and electrically connected to the through Si via 7.

The component electrode 10b is made of a conductive material such as Cu, Ni, Sn, and Al, or an alloy of them. Among these, the conductive material is preferably the same material as the through Si via. The thickness of the component electrode 10b is, for example, 0.1 μm to 10 μm.

(Adhesive Layer)

The adhesive layer 11 adheres and fixes the electronic component 10 to the inside of the interposer structure 2. More specifically, the adhesive layer 11 adheres the third main surface 10c of the electronic component 10 and the second main surface 3b of the Si base layer 3. The thickness of the adhesive layer 11 is, for example, 26 μm or less. When the thickness of the adhesive layer 11 is 26 μm, the thickness of the composite component 1 becomes thin. As a result, the electronic component using the composite component 1 can be downsized and thinned.

(Interposer Structure)

The interposer structure 2 includes the Si base layer 3 and the interposer electrode 16 provided apart from the Si base layer 3, and the electronic component 10 is provided between the Si base layer 3 and the interposer electrode 16. The interposer structure 2 relays, for example, a package board and the electronic component 10 having different terminal pitches.

More specifically, the interposer structure 2 includes the Si base layer 3 having the first main surface 3a and the second main surface 3b facing each other, the rewiring layer 5 formed on the first main surface 3a, the through Si via 7 which is a through electrode and electrically connected to the rewiring layer 5 and penetrating the Si base layer 3, the interposer electrode 16 facing the second main surface 3b, and the adhesive layer 11.

(Through Si Via)

The through Si via 7 includes the through Si via main body 7a and the extending portion 7b.

The extending portion 7b extends from the second main surface 3b of the Si base layer 3, penetrates the adhesive layer 11, and is electrically connected to the component electrode 10b. As described above, the via wiring electrically connected from the component electrode 10b to the rewiring layer 5 includes only the through Si via 7, and thus does not include a solder bump. Therefore, the composite component 1 according to the present embodiment can further reduce the parasitic impedance due to the via wiring. Further, this improves the electrical characteristics of the electronic device using the composite component 1. Furthermore, since the wiring length can be shortened as compared with the related art, the thickness of the composite component 1 can be reduced, and the composite component 1 can be downsized and thinned. The length (that is, the length of the through Si via 7) of the via wiring is, for example, 3 μm to 46 μm, and preferably 3 μm to 36 μm. When the length of the via wiring is 3 μm to 46 μm, the length is shorter than the length of the wiring (for example, about 100 μm) in the related art, so that the parasitic impedance due to the wiring can be further reduced. Thus, the electronic characteristics of the electronic device using the composite component 1 according to the present embodiment are improved. Furthermore, since the wiring length can be shortened, the thickness of the composite component 1 can be reduced, and the composite component 1 can be downsized and thinned.

The through Si via 7 is linear in the stacking direction in FIG. 2. The sectional shape of the through Si via 7 is rectangular in FIG. 2, but is not limited thereto, and may be tapered in the stacking direction. Further, the sectional shape of the through Si via 7 on the XY plane is, for example, a substantially circular shape, a substantially polygonal shape, and a shape in which corners of the substantially polygonal shape are rounded.

Figure 9:
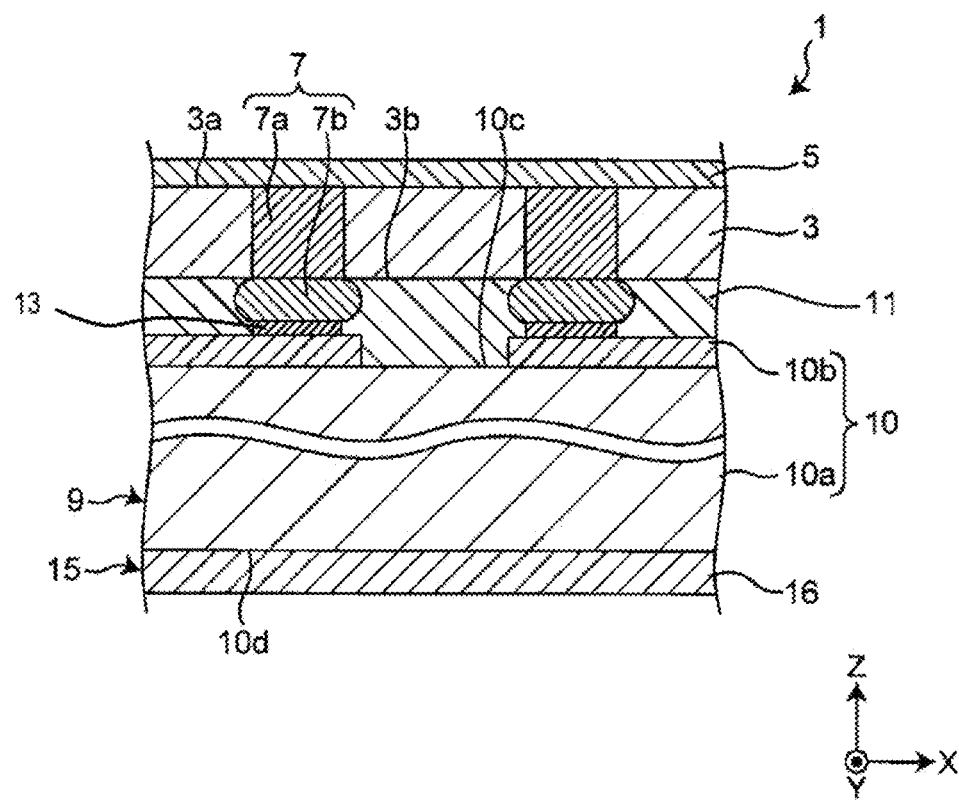
FIG. 9 is a sectional view illustrating a modification to the first embodiment of FIG. 1.

Note that the via wiring may further include a conductive pillar 13 (See FIG. 9) in addition to the through Si via 7. That is, the conductive pillar 13 electrically connects the through Si via 7 and the component electrode to each other. The conductive pillar 13 is preferably configured to include the same conductive material as the conductive material constituting the through Si via 7. In such a case, the connection resistance between the through Si via 7 and the component electrode 10b can be reduced. Therefore, this improves the electrical characteristics of the electronic device using the composite component 1. The shape of the conductive pillar 13 may be, for example, a cylinder and a prism having an interface with the component electrode 10b as a bottom surface. The conductive pillar 13 preferably includes the same type of conductive material as the through Si via 7 and the component electrode 10b. When the conductive pillar 13 includes the same type of conductive material, the connection resistance can be further reduced. The through Si via 7 is configured to include, for example, Cu, Ag, Au or an alloy thereof as a conductive material. The conductive pillar 13 and the through Si via 7 are preferably configured to include Cu as a conductive material. The conductive pillar 13 can be provided on the component electrode 10b of the electronic component 10 before the electronic component layer 9 is disposed on the Si base layer 3.

In FIG. 1, two through Si vias 7 are electrically connected to one component electrode 10b, but the present invention is not limited thereto. For example, one through Si via 7 or three or more through Si vias 7 may be electrically connected to one component electrode 10b. Among them, it is preferable that two or more through Si vias 7 be electrically connected to one component electrode. By electrically connecting two or more through Si vias 7 to one component electrode 10b, the parasitic impedance between the rewiring layer and the electronic component is further reduced, and the electrical characteristics of the electronic device using the interposer are improved.

It is preferable that when a sectional shape of the component electrode 10b in a plane orthogonal to a stacking direction of the composite component 1 is substantially rectangular, and a sectional shape of the through Si via 7 in the plane is substantially circular, a diameter φ of the through Si via 7 satisfy the following expression (1):

$$T(Si)+(T(A)-H(C))/3 \leq \varphi \leq r \quad (1)$$

In Expression (1), T(Si) represents a thickness of the Si base layer 3, T(A) represents a thickness of the adhesive layer 11, H(C) represents a height of the component electrode 10b, and r represents a diameter of a circle inscribed in the sectional shape of the component electrode 10b at an interface between the through Si via 7 and the component electrode 10b.

In the present specification, the diameter of the through Si via 7 refers to the diameter of the through Si via 7 at the interface between the through Si via 7 and the component electrode 10b. When the conductive pillar 13 is formed on the component electrode 10b, the diameter of the through Si via 7 is the diameter of the through Si via 7 at the interface between the through Si via 7 and the conductive pillar 13.

When the conductive pillar 13 is formed on the component electrode 10b, the height of the component electrode 10b also includes the height of the conductive pillar 13.

The diameter of the circle inscribed in the sectional shape of the component electrode 10b at the interface between the through Si via 7 and the component electrode 10b refers to a diameter of a circle inscribed in a sectional shape of the component electrode 10b in the XY section of the composite component 1 illustrated in FIG. 2 at the interface between the through Si via 7 and the component electrode 10b. When the conductive pillar 13 is formed on the component electrode 10b, the diameter of the circle inscribed in the sectional shape of the component electrode 10b is the diameter of the circle inscribed in the sectional shape of the component electrode 10b at the interface between the conductive pillar 13 and the component electrode 10b. Here, when the sectional shape of the component electrode 10b is substantially rectangular, the inscribed circle is a circle that is in contact with the long side of the substantially rectangular shape at two points.

When the diameter φ of the through Si via 7 is equal to or larger than the lower limit value of Expression (1), the diameter φ of the through Si via increases, so that the parasitic impedance of the through Si via is reduced and the electrical characteristics of the electronic device using the composite component are improved. In addition, when the diameter φ of the through Si via 7 is equal to or less than the upper limit value of Expression (1), the electrical connection between the through Si via 7 and the component electrode 10b is further improved, and the short circuit can be effectively prevented.

From the viewpoint of further reducing the parasitic impedance of the through Si via, as a preferable aspect, the maximum diameter of the extending portion 7b is more preferably larger than the maximum diameter of the through Si via main body 7a. The maximum diameter of the through Si via 7 is, for example, the diameter of the through Si via 7 at the interface with the rewiring layer 5.

In order to achieve the above preferable aspect, for example, the extending portion 7b of the through Si via 7 can have a substantially elliptical sectional shape as illustrated in FIG. 2. A preferable aspect can be realized by adjusting the etching speed so as to be different between the material constituting the adhesive layer 11 and the material constituting the Si base layer 3 in a through hole forming step of the method for manufacturing the composite component 1 described later. More specifically, in FIG. 3J, as the material constituting the adhesive layer 11, a material that is easily etched with respect to the material constituting the Si base layer 3 is selected.

The maximum diameter of the extending portion 7b is preferably larger than the minimum diameter of the through Si via main body 7a. In such a case, the parasitic impedance of the through Si via 7 is reduced, and the electrical characteristics of the electronic device using the composite component are improved. The minimum diameter of the through Si via main body 7a is, for example, a sectional diameter of the through Si via 7 in the XY plane including the interface between the Si base layer 3 and the adhesive layer 11.

(Insulating Film, Diffusion Preventing Film, and Seed Layer)

The interposer structure 2 may further include an insulating film, a diffusion preventing film, a seed layer, and a protective layer. The insulating film, the diffusion preventing film, and the protective layer can be disposed, for example, between the through Si via main body 7a and the Si base layer 3 and between the extending portion 7b and the adhesive layer 11. The insulating film prevents a short circuit between the through Si vias 7 illustrated in FIG. 2, for example. The insulating film contains, for example, an insulating substance such as $SiO_2$. The diffusion preventing film is a layer that prevents diffusion of the conductive material constituting the through Si via 7 into the Si base layer 3 and the adhesive layer 11, and includes, for example, a nitride of a transition metal such as Ta and a transition metal such as TaN. The seed layer is a layer used when the through Si via 7 is formed by electrolytic plating. The seed layer is, for example, a conductive material such as Cu. The protective layer is a layer that suppresses surface oxidation of the conductive material constituting the through Si via 7 and protects the through Si via 7. The protective layer contains an insulating silicon compound such as SiN and SiCN. The thickness of the seed layer is, for example, 0.01 to 0.20 µm. Specific examples of the protective layer include SiN (thickness: 0.15 µm) and SiCN (0.02 µm). The insulating film, the diffusion preventing film, the seed layer, and the protective layer are each represented by the line segment delineating the through Si via 7 and the Si base layer 3, the line segment delineating the through Si via 7 and the adhesive layer 11, and the line segment delineating the adhesive layer 11 and the Si base layer 3 in FIG. 2.

As described above, the insulating film includes, for example, a first insulating film located between the through Si via 7 and the Si base layer 3 and a second insulating film located between the adhesive layer 11 and the Si base layer 3. The thickness of the second insulating film is preferably less than the thickness of the first insulating film, and this makes it possible to further increase the diameter of the through Si via 7 in the adhesive layer 11. As a result, the parasitic impedance of the through Si via 7 is further reduced, and the electrical characteristics of the electronic device using the composite component 1 are improved.

(Si Base Layer)

The thickness of the Si base layer 3 is, for example, 3 µm to 20 µm. On the other hand, the thickness of the Si base layer 3 of the composite component 1 in the related art, illustrated in FIGS. 7 and 8, is about 100 µm. The reason why the thickness of the Si base layer 3 can be extremely reduced as described above is that, in the method for manufacturing the composite component 1 to be described later, the Si support is bonded to the Si base layer 3 to reinforce the strength, and thus, although the Si base layer is ground and thinned, breakage (cracking or the like) of the Si base layer 3 due to insufficient strength hardly occurs. This is because a Si support 19 is bonded to the second main surface 3b of the electronic component 10 before the Si base layer 3 is ground (refer to FIG. 3D). The reinforcement of the strength by the Si support 19 enables manufacturing of the composite component 1. Since the thickness of the Si base layer 3 can be extremely reduced as compared with the case in the related art, the length of the wiring electrically connected from the component electrode 10b of the electronic component 10 to the rewiring layer 5 can be shortened. The Si base layer 3 is substantially made of Si.

(Rewiring Layer)

The rewiring layer 5 is a multilayer wiring layer. The rewiring layer 5 converts, for example, the wiring layout of the through Si via 7 on the first main surface side of the Si base layer 3 into a component electrode layout of an electronic component arranged on the rewiring layer 5. That is, the through Si via 7 and the electronic component arranged on the rewiring layer 5 are electrically connected via the rewiring layer 5 to form a desired electric circuit. The rewiring layer 5 includes a wiring and a dielectric film 21. The wiring includes a conductive material. The conductive material is, for example, Cu, Ag, and Au, and alloys containing them, and among them, Cu is preferable. The rewiring layer 5 can include a plurality of layers, and includes, for example, two or more layers of conductive wiring and one or more layers of dielectric films. The thickness of one layer of the conductive wiring and one layer of the dielectric film constituting the rewiring layer is, for example, 1.5 µm to 5.0 µm. In this case, the thickness of the rewiring layer is a value (unit: µm) obtained by multiplying the thickness of one layer (1.5 µm to 5.0 µm) by the total number of layers in the rewiring layer.

The dielectric film has a conductive via. The conductive via electrically connects wirings between different layers in the rewiring layer. The dielectric film includes, for example, $Si_3N_4$ and $SiO_2$. The thickness of the dielectric film is, for example, 0.1 to 2 µm. The dielectric film may be a multicomponent film containing two or more kinds of components. The multicomponent film may be a multilayer film in which a plurality of layers is formed for each component. The layer structure of the multilayer film is, for example, $SiO_2$ (thickness 0.25 µm)/$Si_3N_4$ (thickness 0.1 µm)/$SiO_2$ (thickness 0.25 µm)/$Si_3N_4$ (thickness 0.1 µm) in this order from the Si base layer side.

(Interposer Electrode Layer, Interposer Electrode)

The interposer electrode layer 15 is a layer interposed between the composite component 1 and another electronic component when another electronic component can be mounted on the composite component 1. The interposer electrode layer 15 is a layer interposed between the composite component 1 and the electronic device when the composite component 1 is mounted on the electronic device. The interposer electrode layer 15 includes the interposer electrode 16 and a dielectric film. The interposer electrode 16 electrically connects the composite component and another electronic component or electronic device, and the dielectric film electrically isolates necessary portions between the composite component 1 and another electronic component or electronic device. The interposer electrode 16 is, for example, Cu, Ag, and Au and an alloy containing them, and among them, Cu is preferable. Electrical connection between the interposer electrode 16 and the electronic device is performed by a solder bump. The interposer electrode 16 can have a plating layer made of Ni or Au on the surface to correspond to the solder bump.

(Method for Manufacturing Composite Component)

Next, a method for manufacturing the composite component 1 will be described.

A method for manufacturing the composite component 1 includes an electronic component adhering step of forming the adhesive layer 11 on the Si base layer 3 and adhering the electronic component 10 onto the Si base layer 3 with the adhesive layer 11 interposed therebetween; a Si support bonding step of bonding the Si support 19 on the electronic component 10; a Si base layer thinning step of thinning the Si base layer 3; a through hole forming step of forming a through hole 25 in the thinned Si base layer 3 and the adhesive layer 11 to expose the component electrode 10b of the electronic component 10; and a through Si via forming step of forming the through Si via 7 in the through hole 25 by electrolytic plating.

The method for manufacturing the composite component 1 may further include the steps of a Si base layer preparing step of preparing the Si base layer 3; an electronic component thinning step of grinding and thinning the electronic component 10; a dielectric film forming step of forming the dielectric film 21 having a predetermined pattern on the Si base layer 3; a rewiring layer forming step of forming the rewiring layer 5; an interposer electrode forming step of forming the interposer electrode 16; and a dicing step of dicing into pieces by cutting with a dicing machine.

Specifically, an example of a method for manufacturing the composite component 1 will be described with reference to FIGS. 3A to 3L. FIGS. 3A to 3L are diagrams for explaining a method for manufacturing the composite component 1. The method for manufacturing the composite component 1 according to the first embodiment includes a Si base layer preparing step, an electronic component adhering step, an electronic component thinning step, a Si support forming step, a Si base layer thinning step, a dielectric film forming step, a through hole forming step, a through Si via forming step, a rewiring layer forming step, an interposer electrode forming step, and a dicing step.

Although a mother integrated body in which the composite component 1 is integrated is prepared from the Si base layer forming step to the rewiring layer forming step, a manufacturing method will be described focusing on one composite component 1 for convenience of description.

(Si Base Layer Preparing Step)

In the Si base layer preparing step, a Si wafer is prepared as the Si base layer 3. The shape of the Si wafer may be, but is not limited to, a cylindrical shape. When the shape of the Si wafer is a cylindrical shape, the thickness of the Si wafer is, for example, 755 μm (diameter φ 300 mm of the Si wafer), 725 μm (φ 200 mm), 625 μm (φ 150 mm), and 525 μm (φ 100 mm).

(Electronic Component Adhering Step)

Figure 3A:
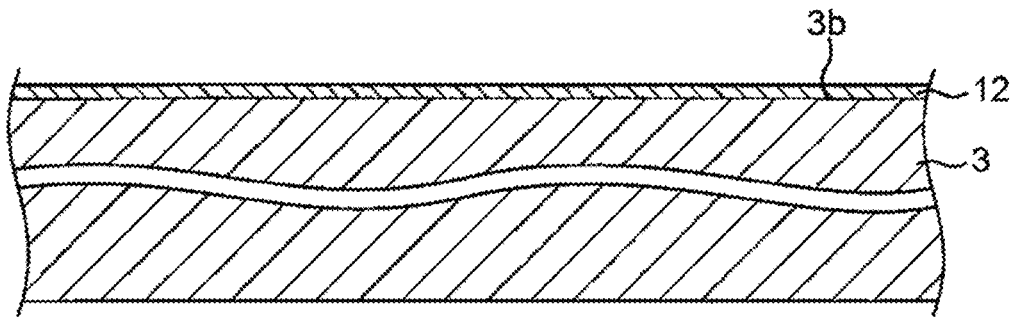
FIG. 3A is an explanatory view for explaining a method for manufacturing a composite component.

In the electronic component adhering step, an adhesive is applied onto the Si base layer 3, and the electronic component 10 is disposed thereon to cure the adhesive. As a result, the electronic component 10 is adhered onto the Si base layer 3 to form the adhesive layer 11. As described above, in the present embodiment, the electronic component 10 is the electronic component layer 9. Specifically, as illustrated in FIG. 3A, an adhesive coating film 12 is formed on the second main surface 3b of the Si base layer 3. Thus, a coating film-formed Si base layer is prepared. The coating method is, for example, spin coating. It is preferable to perform coating by controlling the thickness of the coating film 12 to be in the range of the thickness of the component electrode 10b of the electronic component 10 to 26 μm.

The adhesive is, for example, a thermosetting resin. Such a thermosetting resin is, for example, a thermosetting resin containing benzocyclobutene (BCB) in a repeating unit, and can be obtained by, for example, polymerizing 1,3-divinyl-1,1,3,3-tetramethyldisiloxane-bis-benzocyclobutene (DVS-bis-BCB). Examples of the commercially available product include "CYCLOTENE" manufactured by The Dow Chemical Company.

In the electronic component adhering step, a conductive pillar 13 may be provided on the component electrode 10b of the electronic component 10 before the electronic component 10 is disposed on the Si base layer 3.

Figure 3B:
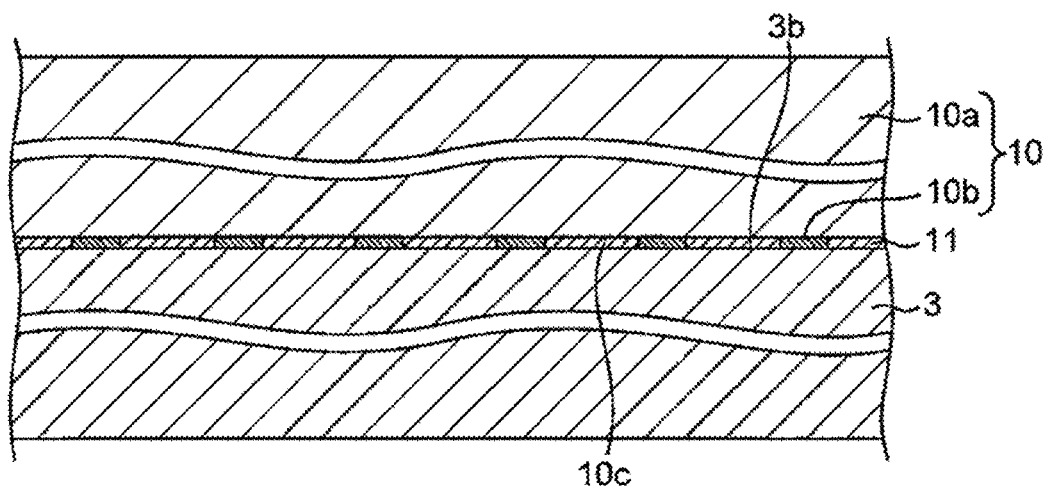
FIG. 3B is an explanatory view for explaining a method for manufacturing a composite component.

As illustrated in FIG. 3B, the electronic component 10 is disposed at a predetermined position on the coating film 12 using an apparatus including a vacuum chamber. Specifically, a wafer (electronic component integrated wafer) on which a plurality of electronic components 10 are integrated is bonded to the coating film-formed Si base layer. Pressure is applied bidirectionally along the stacking direction of the electronic component 10 to heat the electronic component.

Specifically, the coating film-formed Si base layer is set on a lower stage in a vacuum chamber in the apparatus. The electronic component 10 is vacuum-suctioned to the upper stage in the vacuum chamber so that the component electrode 10b of the electronic component 10 faces the coating film 12. For alignment between the coating film-formed Si base layer and the electronic component integrated wafer, for example, a recognition mark of the Si base layer 3 is used. The electronic component 10 is disposed on the coating film 12 side of the coating film-formed Si base layer. The pressure is applied bidirectionally along a direction in which the upper and lower stages face each other, and heating is performed.

The heating (adhesive curing) is performed by, for example, heating a set of the Si base layer 3 (Si wafer/adhesive/electronic component) obtained by bonding the electronic component 10 with an adhesive using a hot plate heated to 250° C. or a hot air circulation oven for 1 hour. As a result, the adhesive is cured to form the adhesive layer 11. The coating film 12 can be preliminarily cured (adhesive soft cured) after bonding and before curing of the adhesive. The pre-curing is performed by heating the bonded Si base layer 3 for 15 minutes using, for example, a hot plate heated to 150° C. By pre-curing, vacuum voids can be removed in the adhesive layer 11.

Note that the Si base layer 3 can be treated before and after the formation of the coating film 12. A pre-treatment is, for example, a cleaning treatment and an adhesion improving treatment. In the cleaning treatment, the second main surface 3b of the Si base layer 3 is cleaned to remove contamination. In the adhesion improving treatment, an adhesion improver (for example, "AP 3000" manufactured by DOW) is applied to the second main surface 3b to form the coating film 12. Accordingly, the adhesion between the second main surface 3b and the coating film 12 is improved. A post-treatment is, for example, a preheating (soft baking) treatment. After the coating film 12 is formed, preheating is performed to stabilize the coating film 12.

In the preheating, for example, the coating film 12 is heated for about 60 seconds using a hot plate heated to 80° C. to 150° C. In addition, a recognition mark can be formed on the Si base layer 3. The recognition mark is used for alignment between the Si base layer 3 and the electronic component 10 when the electronic component 10 is adhered to the Si base layer 3 in a subsequent process.

(Electronic Component Thinning Step)

Figure 3C:
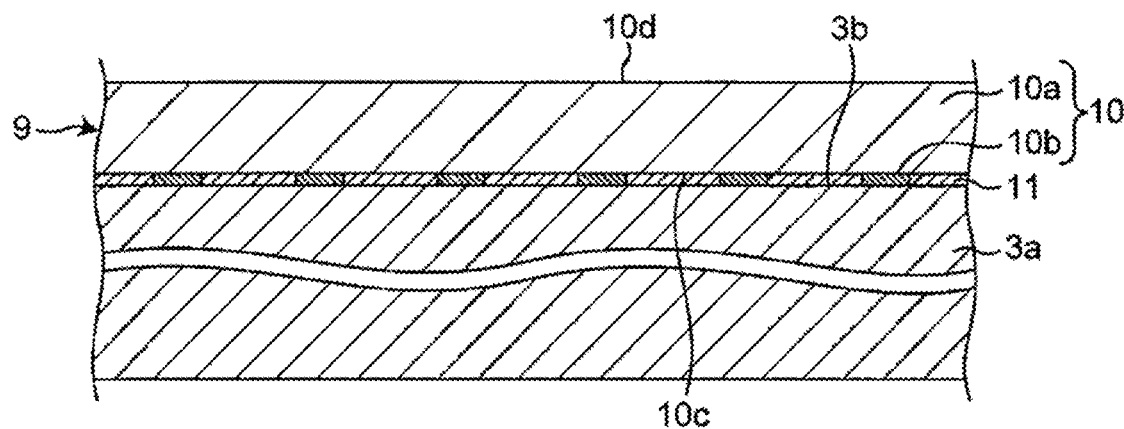
FIG. 3C is an explanatory view for explaining a method for manufacturing a composite component.

As illustrated in FIG. 3C, in the electronic component thinning step, the electronic component 10 is ground using a back grinder to be thinned. In the electronic component thinning process, a surface of the electronic component 10 on which the component electrode 10b is not disposed is ground. The amount of grinding is preferably as large as possible, but the functional portion inside the electronic component 10 is not damaged. The functional portion is, for example, a dielectric and an electrode in the case of a capacitor, and is a wiring in the case of an inductor. The thickness of the electronic component layer 9 after thinning is, for example, 50 to 150 μm.

In the electronic component thinning process, a flattening treatment can be performed as a final finish after grinding the electronic component 10. Examples of the flattening treatment include dry polishing and chemical mechanical polishing (CMP). By the flattening treatment, for example, the flatness of the ground fourth main surface 10d can be expressed by total thickness variation (TTV). The polished surface of the electronic component 10 subjected to the flattening treatment is 2 μm or less with respect to the thickness of 5 μm of the adhesive layer 11 formed in the subsequent step. For example, when the electronic component 10 using a Si wafer of φ 300 mm is subjected to a polishing treatment, the TTV of the polished surface of the electronic component 10 becomes 1.5 μm.

(Si Support Bonding Step)

Figure 3D:
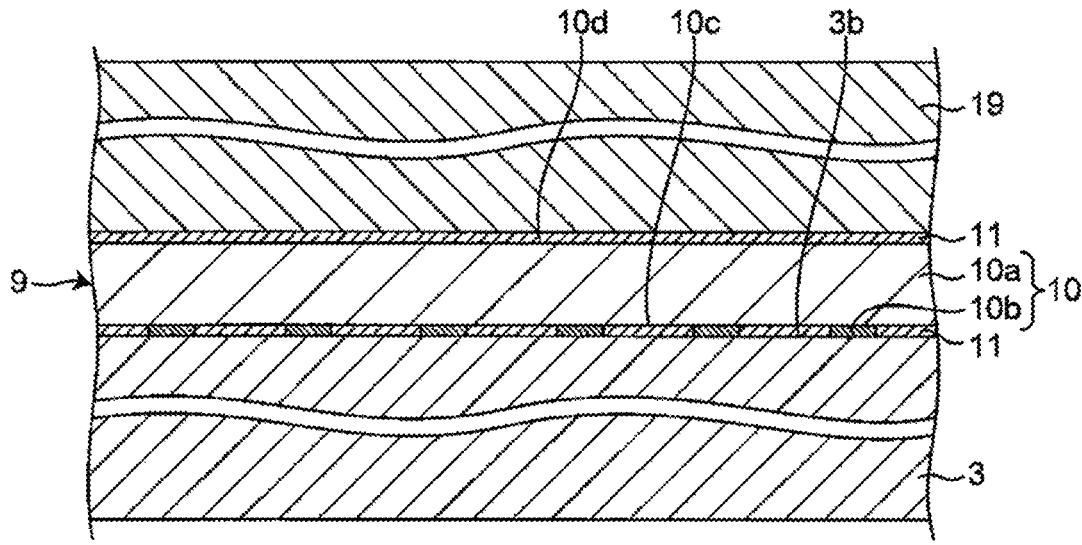
FIG. 3D is an explanatory view for explaining a method for manufacturing a composite component.

In the Si support bonding step, as illustrated in FIG. 3D, the Si support 19 is bonded to the electronic component 10. Specifically, the Si wafer described in the Si base layer preparing step is separately prepared as the Si support 19. Next, the adhesive coating film 12 is formed on the Si support 19 by the method described in the electronic component adhering step. Thereafter, the electronic component 10 is bonded onto the Si support 19 such that the polished surface (fourth main surface 10d) of the electronic component 10 is in contact with the coating film 12, and is heated by applying pressure. As a result, the Si support 19 is formed on the ground surface of the electronic component 10. The purpose of providing the Si support 19 is to prevent occurrence of adverse effects (more specifically, reduction in strength, and the like) due to a thinner layer in the manufacturing process than before in the subsequent Si base layer thinning process.

The Si support 19 can be thinned before bonding as necessary from the viewpoint of improving processability. This is because a dielectric film is formed using semiconductor device equipment in a subsequent step. For example, when the thickness of the electronic component 10 is 150 µm, a Si wafer (φ 300 mm, typical thickness 775 µm) as the Si support 19 is thinned to about 625 µm.

(Si Base Layer Thinning Step)

Figure 3E:
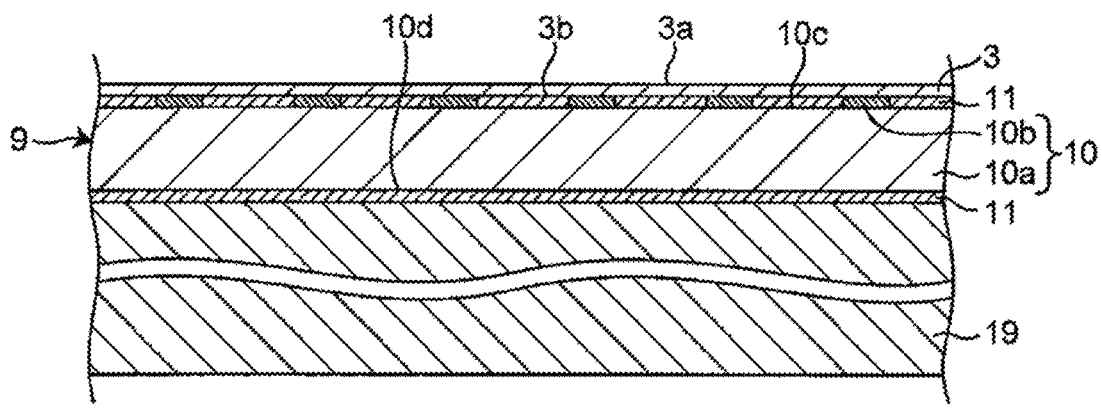
FIG. 3E is an explanatory view for explaining a method for manufacturing a composite component.

In the Si base layer thinning step, as illustrated in FIG. 3E, the Si base layer 3 is ground by the same method as in the electronic component thinning step to flatten the ground surface. The grinding amount is preferably as large as possible within a range in which the above adverse effects can be prevented and, for example, constant strength can be maintained. In consideration of variations in the flattening of the ground surface, the thickness of the Si base layer 3 after thinning is preferably 3 µm or more. The thickness of the Si base layer 3 after thinning is more preferably 5 µm or more and still more preferably 10 µm or more when the flatness of the polished surface is 2 µm in consideration of variations in flattening of the polished surface.

(Dielectric Film Forming Step)

Figure 3F:
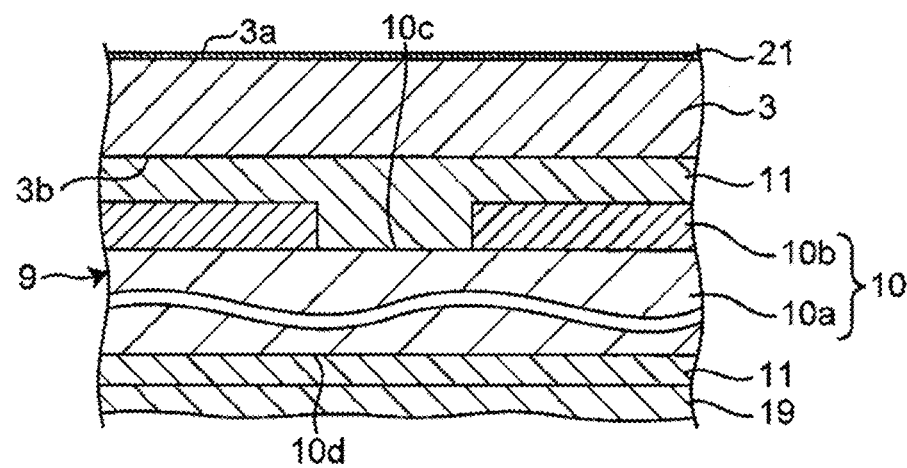
FIG. 3F is an explanatory view for explaining a method for manufacturing a composite component.
Figure 3G:
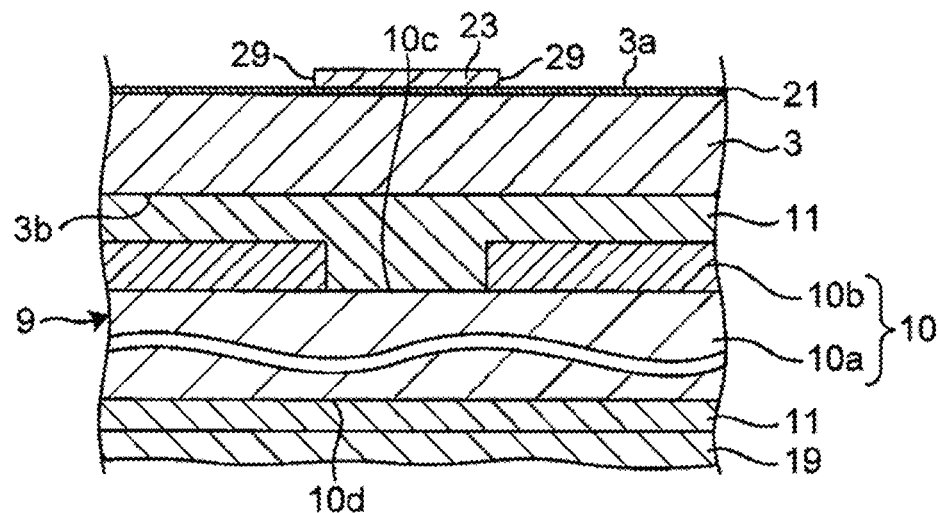
FIG. 3G is an explanatory view for explaining a method for manufacturing a composite component.
Figure 3H:
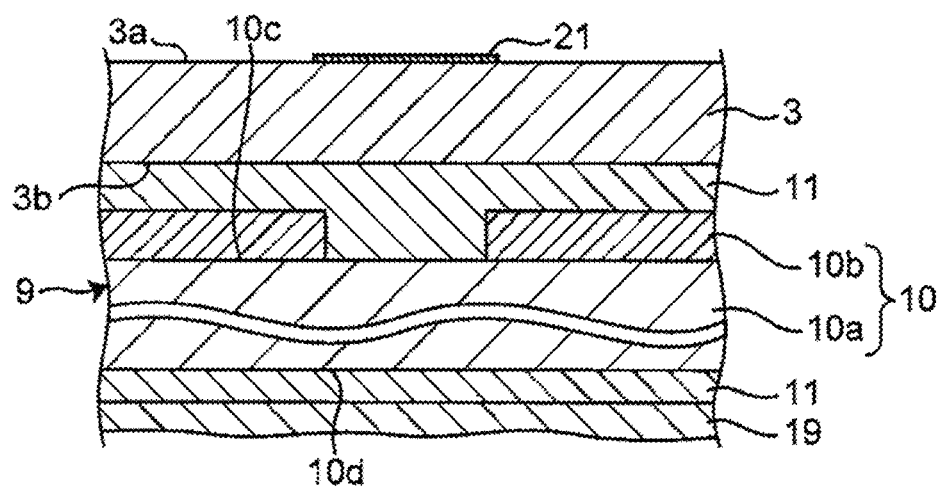
FIG. 3H is an explanatory view for explaining a method for manufacturing a composite component.

In the dielectric film forming step, as illustrated in FIGS. 3F, 3G, and 3H, a dielectric film 21 having a desired pattern is formed on the Si base layer 3. Specifically, as illustrated in FIG. 3F, a dielectric film (thickness: 0.1 to 0.2 µm) 21 is formed on the entire surface of the Si base layer 3 by using a Chemical Vapor Deposition (CVD) method such as PECVD. One or more layers of the dielectric film 21 may be formed. For example, when the four-layer dielectric film 21 is formed, $SiO_2$: 0.25 µm/$Si_3N_4$: 0.1 µm/$SiO_2$: 0.25 µm/$Si_3N_4$ 0.1 µm can be formed in this order from the Si base layer 3 side.

In the dielectric film forming step, the surface of the Si base layer 3 can be cleaned before the dielectric film 21 is formed. The cleaning is, for example, wet cleaning and oxygen plasma ashing.

It should be noted that FIGS. 3F to 3L are enlarged as compared with FIGS. 3A to 3E.

Next, as illustrated in FIG. 3G, the dielectric film 21 is patterned using a photolithography method. A liquid resist is spin-coated to form a photoresist film 23 on the entire surface of the dielectric film 21. The photoresist film 23 is exposed through a mask corresponding to a desired pattern. The exposed photoresist film 23 is developed. The dielectric film 21 of the photoresist film 23 is selectively removed using reactive ion etching (RIE). For example, in a case where the above-described four-layered dielectric film is formed, two layers on the surface side of the dielectric film 21 (the surface side facing the Si base layer 3 side in the dielectric film) are selectively removed. Thereafter, the photoresist film 23 is peeled off. As a result, the dielectric film 21 having a desired pattern illustrated in FIG. 3H is formed on the Si base layer 3. The dielectric film 21 functions as an insulating film that electrically insulates the two through Si vias 7 illustrated in FIG. 2 from each other.

The first main surface 3a of the Si base layer 3 may further include a mark layer. The mark layer can be detected by an IR camera to perform alignment in a photolithography method.

(Through Hole Forming Step)

Figure 3I:
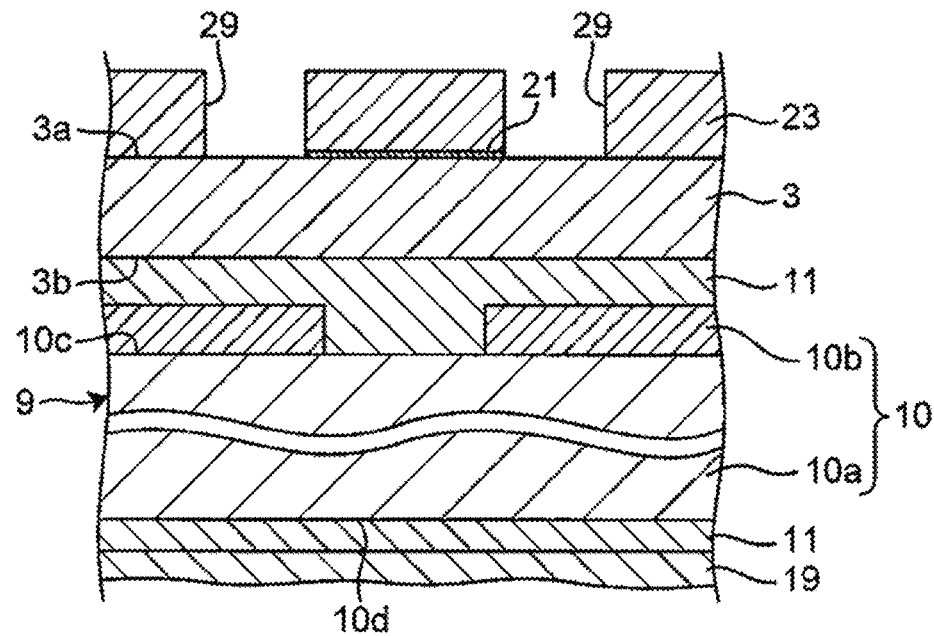
FIG. 3I is an explanatory view for explaining a method for manufacturing a composite component.
Figure 3J:
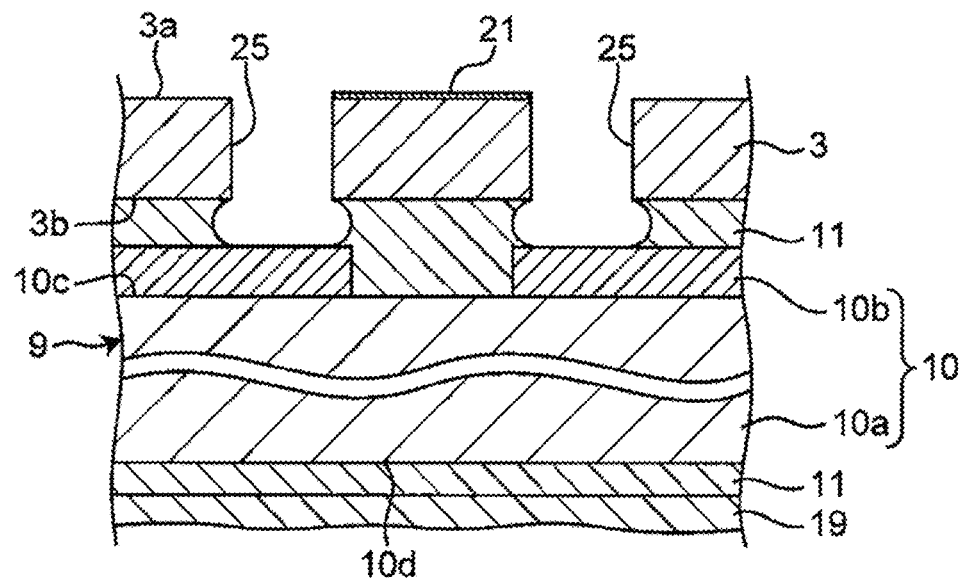
FIG. 3J is an explanatory view for explaining a method for manufacturing a composite component.

In a through hole forming step, as illustrated in FIGS. 3I and 3J, a through hole 25 is formed in the Si base layer 3 and the adhesive layer 11. Specifically, the photoresist film 23 is formed on the entire surface. The photoresist film 23 is exposed through a mask corresponding to the pattern of the through Si via 7. The exposed photoresist film 23 is developed to form a photoresist film 23 having a predetermined pattern as illustrated in FIG. 3I. As illustrated in FIG. 3J, the Si base layer 3 and the adhesive layer 11 existing in the Z direction from a cavity 29 of the photoresist film 23 are selectively removed (etched). The etching is performed using, for example, RIE. As a result, the through hole 25 is formed, and the component electrode 10b is exposed. Here, the extending portion 7b has an elliptical shape. This is because the material constituting the adhesive layer 11 is easily etched as compared with the material constituting the Si base layer 3.

(Through Si Via Forming Step)

Figure 3K:
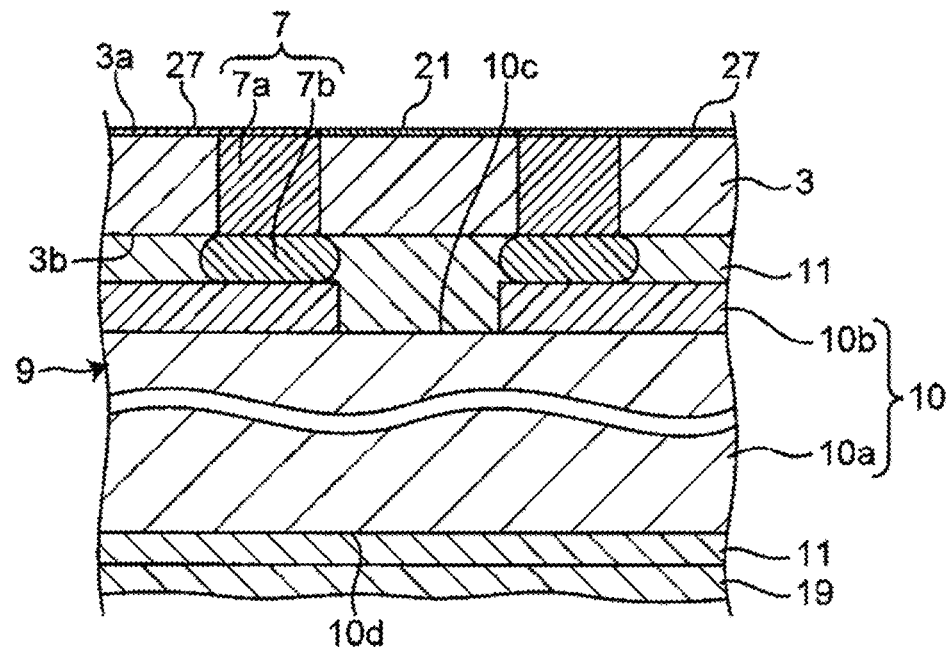
FIG. 3K is an explanatory view for explaining a method for manufacturing a composite component.

In the through Si via forming step, as illustrated in FIG. 3K, the through Si via 7 is formed in the through hole 25. The through Si via 7 is formed in the through hole 25 by electrolytic plating (more specifically, electrolytic Cu plating) using a dual damascene method (more specifically, a Cu dual damascene method).

Here, the through Si via forming step may further include an insulating film forming step, a diffusion preventing film forming step, a protective layer forming step, and a seed layer forming step before forming the through Si via 7. In the insulating film forming step, before the formation of the through Si via 7, an insulating film is formed on a surface (inner wall surface) where the Si base layer 3 is exposed in the through hole 25 illustrated in FIG. 3J. In the diffusion preventing film forming step, a diffusion preventing film is formed on the insulating film. In the protective layer forming step, a protective layer is formed on the diffusion preventing film. The protective layer functions as a protective layer of a conductive material (more specifically, Cu or the like) constituting the through Si via 7, and suppresses surface oxidation of the conductive material. The seed layer is a layer through which electricity flows when the through Si via 7 is formed by an electrolytic plating method. The seed layer is, for example, a conductive material such as Cu.

In addition, the through Si via forming step may include a flattening step after the formation of the through Si via 7. In the flattening step, for example, CMP is used to flatten the top surface of the through Si via 7.

(Rewiring Layer Forming Step)

Figure 3L:
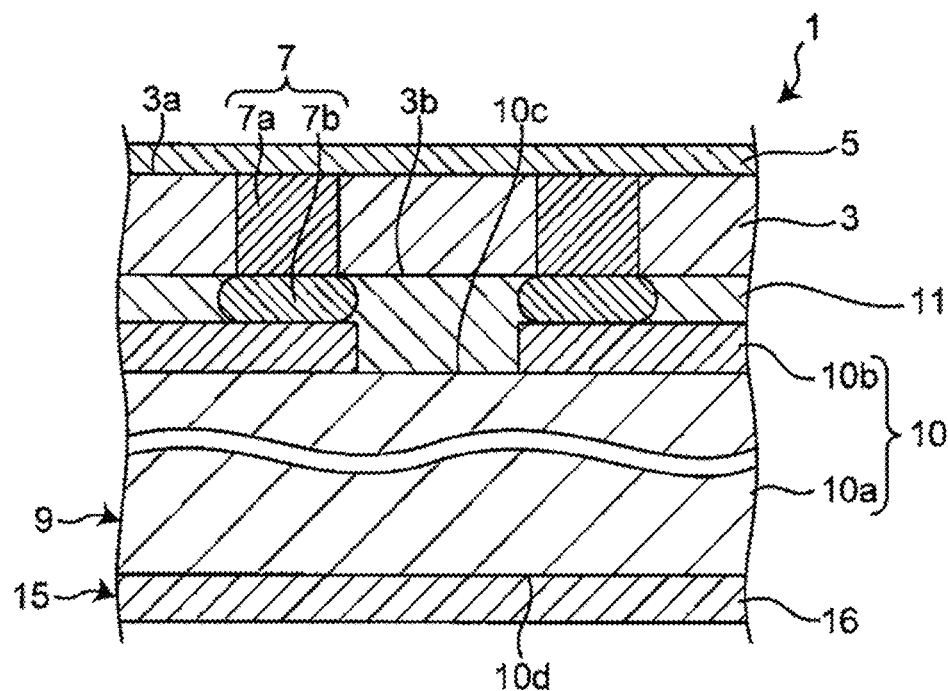
FIG. 3L is an explanatory view for explaining a method for manufacturing a composite component.

In the rewiring layer forming step, as illustrated in FIG. 3L, a dielectric film and a wiring having a predetermined pattern are formed by the above-described photolithography method and etching to form the rewiring layer 5. The Si support 19 and the adhesive layer 11 are removed to form the interposer electrode 16. In the rewiring layer forming step, a thinning treatment of the Si support 19 may be performed instead of deleting the Si support 19 and the adhesive layer 11. In the thinning treatment, for example, the Si support 19 is ground to make the thickness of the Si support 19 the same as the thickness of the Si base layer 3. When the thickness of the Si support 19 is made equal to the thickness of the Si base layer 3 in this manner, the Si support 19 and the Si base layer 3 are substantially plane-symmetrical with respect to the electronic component layer 9.

This further reduces the warpage of the composite component 1.

(Dicing Step)

In the dicing step, the mother integrated body is cut with a dicing machine. With this, the composite component 1 is manufactured.

EXAMPLES

The composite component illustrated in FIG. 2 was produced according to the method for producing the composite component 1 described above.

Specifically, an electronic component was attached onto the Si base layer using an adhesive ("CYCLOTENE" manufactured by The Dow Chemical Company). Thus, an adhesive layer was formed. The thickness of the formed adhesive layer was 5 μm. The thickness of the partial electrode of the electronic component was 2 μm. The electronic component was ground, and the thickness of the electronic component was set to 100 μm. The Si support was bonded onto the thinned electronic component, and the Si base layer was ground to be thinned. The thickness of the thinned Si base layer was 10 μm. A dielectric film having a predetermined pattern was formed on the thinned Si base layer. A photoresist film was formed on the Si base layer, and through holes were formed in the Si base layer and the adhesive layer by RIE. An insulating film, a diffusion preventing film, and a seed layer were sequentially formed on inner walls of the Si base layer and the adhesive layer in the through hole. The Si base layer and the adhesive layer in the cavity of the photoresist film were selectively removed using a Cu dual damascene method, and a through Si via connected to a component electrode was formed by Cu electrolytic plating. As a result, a through Si via in which the component electrode was exposed was formed. The formed through Si via had a diameter of 10 μm. The thickness of the extending portion was 3 μm, and the sectional shape of the extending portion was elliptical. Five rewiring layers were formed on the Si base layer. The thickness of the rewiring layer was 2.5 μm (0.5 μm×5). The wiring from the rewiring layer to the component electrode was configured to include only the through Si via. The length of the wiring was 13 μm. Thereafter, the Si support was peeled off, and an interposer electrode (thickness: 15 μm) was formed on the peeled electronic component. The thickness of the interposer electrode was 5 μm. The thickness of the prepared composite material was 117.5 μm.

Comparative Example

As a comparative example, a composite component configured using the interposer described in NPL 1 is illustrated in FIGS. 7 and 8. The composite component 101 of this comparative example is obtained by replacing the substrate in "TSV+C4 bump EM test structure" described in FIG. 7 of NPL 1 described above with an electronic component. This will be described with reference to FIGS. 7 and 8. FIG. 7 is a sectional view of a composite component of a comparative example. FIG. 8 is an enlarged view of a part (part C) of FIG. 7. As illustrated in FIGS. 7 and 8, the composite component 101 is an electronic component surface mount type composite component in which an electronic component 110 is surface-mounted on an interposer electrode 116. The composite component 101 includes an electronic component 110 and an interposer structure 102 in which the electronic component 110 is mounted by a solder bump 111. The interposer structure 102 includes a Si base layer 103 having a first main surface 103a and a second main surface 103b facing each other, a rewiring layer 105 formed on the first main surface 103a, a through Si via 107 electrically connected to the rewiring layer 105 and penetrating the Si base layer 103, and an interposer electrode 116 formed on the second main surface 103b with a predetermined pattern and electrically connected to the through Si via 107.

The via wiring from the rewiring layer 105 to the component electrode 110b of the electronic component 110 includes a through Si via (thickness 100 μm) 107, an interposer electrode (thickness 5 μm) 116, and a solder bump (thickness 15 μm) 111. The wiring length was 120 μm.

Second Embodiment

Figure 4:
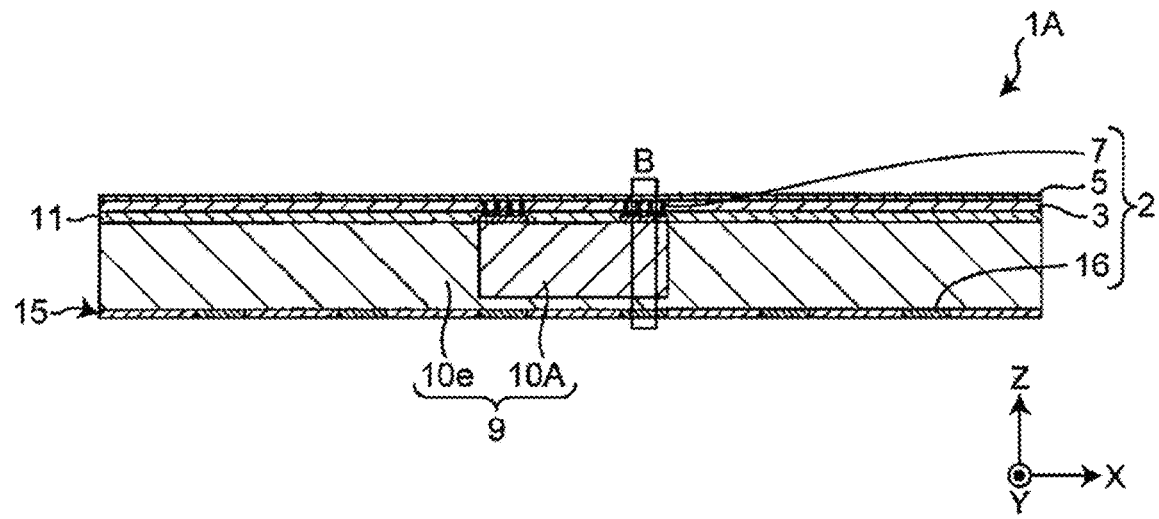
FIG. 4 is a sectional view illustrating a second embodiment of a composite component.
Figure 5:
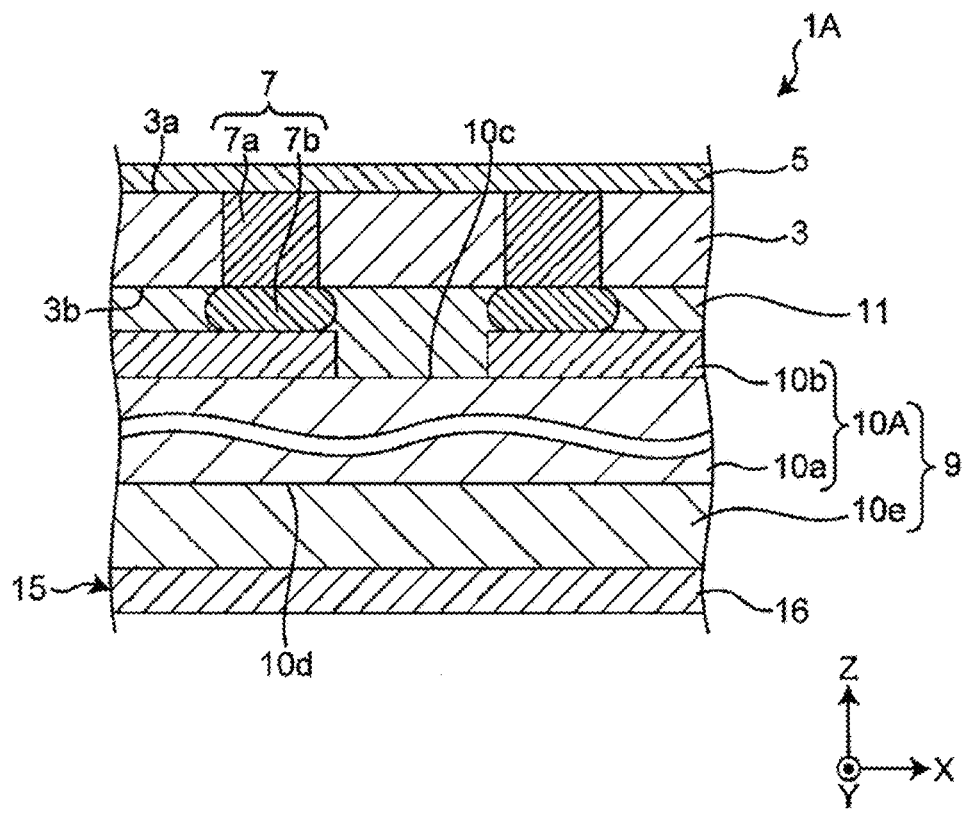
FIG. 5 is an enlarged view of a portion B in FIG. 4.

A composite component 1A according to a second embodiment will be described with reference to FIGS. 4 and 5. FIG. 4 is a sectional view illustrating a second embodiment of the composite component 1A. FIG. 5 is a modification of an enlarged view of a part of FIG. 4 (enlarged view of part B). The second embodiment is different from the first embodiment in that the electronic component layer 9 includes an electronic component 10A and a resin 10e that integrates the electronic component 10A. This different configuration will be described below. In the second embodiment, the same reference numerals as those of the first embodiment denote the same configurations as those of the first embodiment, and thus the description thereof will be omitted.

(Configuration)

As illustrated in FIG. 5, in the composite component 1A of the second embodiment, the electronic component layer 9 includes an electronic component 10A and a resin 10e that integrates the electronic component 10A. In the composite component 1A of the second embodiment, since the electronic component 10A can be integrated with the resin 10e, although an electronic component (more specifically, a general-purpose electronic component) of which a dimension does not match that of the Si base layer 3 can be mounted. Accordingly, a low-cost and high-performance electronic component can be used. In addition, design with a high degree of freedom becomes possible, and the electronic components can be combined according to applications.

In FIG. 5, the electronic component layer 9 includes one type of electronic component 10A, but is not limited thereto. The electronic component layer 9 may include two or more electronic components 10A of at least one type.

It is preferable that the resin 10e is an epoxy resin, and the resin 10e further contains $SiO_2$ filler dispersed in the resin 10e. In such a case, the linear expansion coefficient of the electronic component layer 9 in which the electronic component 10A is integrated with the resin 10e can be brought close to the linear expansion coefficient of the Si base layer 3. This can reduce warpage of the composite component 1A during manufacturing of the composite component 1A and improve reliability of the composite component 1A.

(Method for Manufacturing Composite Component 1A)

A method for manufacturing a composite component 1A according to the second embodiment includes an electronic component adhering step of forming an adhesive layer on a Si base layer 3 and adhering an electronic component 10A on the Si base layer 3 with the adhesive layer 11 interposed therebetween; an electronic component sealing step of sealing the electronic component 10A with a resin 10e to form an integrated electronic component layer 9; a Si support forming step of forming a Si support 19 on the electronic component layer 9; a Si base layer thinning step of thinning the Si base layer 3; a through hole forming step of forming a through hole 25 in the thinned Si base layer 3 and the adhesive layer 11 to expose a component electrode 10b of the electronic component 10A; and a through Si via forming step of forming a through Si via 7 in the through hole 25 by electrolytic plating.

A method for manufacturing a composite component 1A may further include the steps of a Si base layer preparing step of preparing the Si base layer 3; an electronic component layer thinning step of grinding and thinning the electronic component layer 9; a dielectric film forming step of forming a dielectric film 21 having a predetermined pattern on the Si base layer 3; a rewiring layer forming step of forming the rewiring layer 5; an interposer electrode forming step of forming the interposer electrode; and a dicing step of dicing into pieces by cutting with a dicing machine.

An example of a method for manufacturing the composite component 1A will be described with reference to FIGS. 6A to 6M.

FIGS. 6A to 6M are diagrams for explaining a method for manufacturing the composite component 1A.

(Si Base Layer Preparing Step, Electronic Component Adhering Step)

Figure 6A:
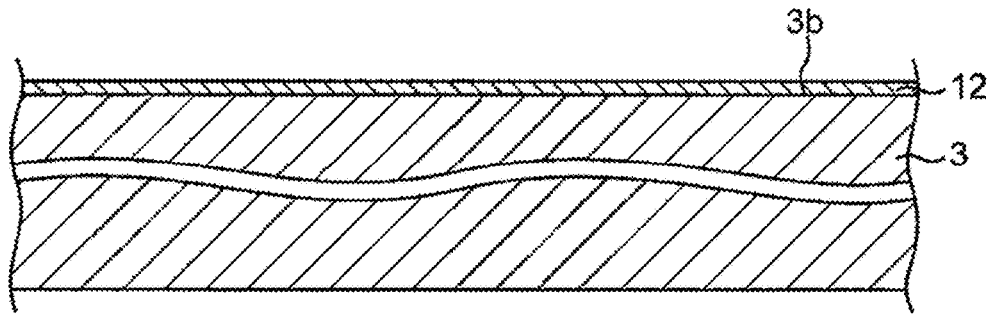
FIG. 6A is an explanatory view for explaining a method for manufacturing a composite component.
Figure 6B:
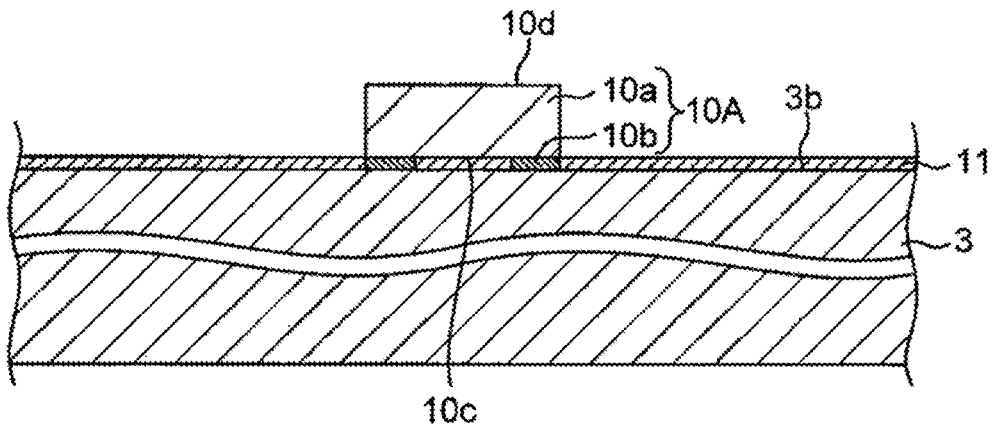
FIG. 6B is an explanatory view for explaining a method for manufacturing a composite component.

As illustrated in FIG. 6A, an adhesive coating film 12 is formed on the Si base layer 3 in the same manner as in FIG. 3A. As illustrated in FIG. 6B, the electronic component 10A is mounted at a predetermined position on the coating film 12 using a surface mount machine for the electronic component 10A. Pressure is applied bidirectionally along the stacking direction of the Si base layer 3, and heating is performed. Specifically, the electronic component 10A is vacuum-suctioned using the head of the surface mount machine. The electronic component 10A is positioned and disposed such that the electronic component 10A faces the application surface of the component electrode 10b. The Si base layer 3 on which the electronic component 10A is disposed is heated. As a result, the adhesive is cured to form an adhesive layer, and the electronic component 10A is adhered onto the Si base layer 3. At the time of heating, pressure may be applied bidirectionally along the stacking direction of the Si base layer 3.

(Electronic Component Sealing Step)

Figure 6C:
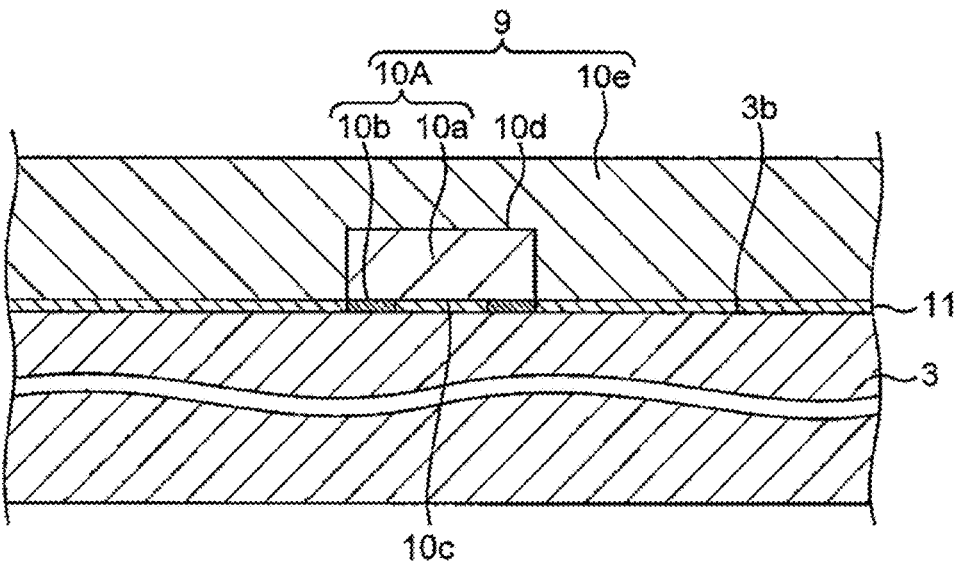
FIG. 6C is an explanatory view for explaining a method for manufacturing a composite component.

In the electronic component sealing step, as illustrated in FIG. 6C, the mounted electronic component 10A is sealed with the resin (sealing resin) 10e. As a result, the integrated electronic component layer 9 is formed. Specifically, the liquid resin is applied onto the Si base layer 3 on which the electronic component 10A is mounted using a dispenser. Thereafter, the applied resin is molded using a compression molding device. Thereafter, the resin is cured using, for example, a hot air circulation oven. The heat treatment condition in curing is, for example, 150° C. for 1 hour. Thus, the electronic component layer 9 is formed.

(Electronic Component Layer Thinning Step to Rewiring Layer Forming Step)

Figure 6D:
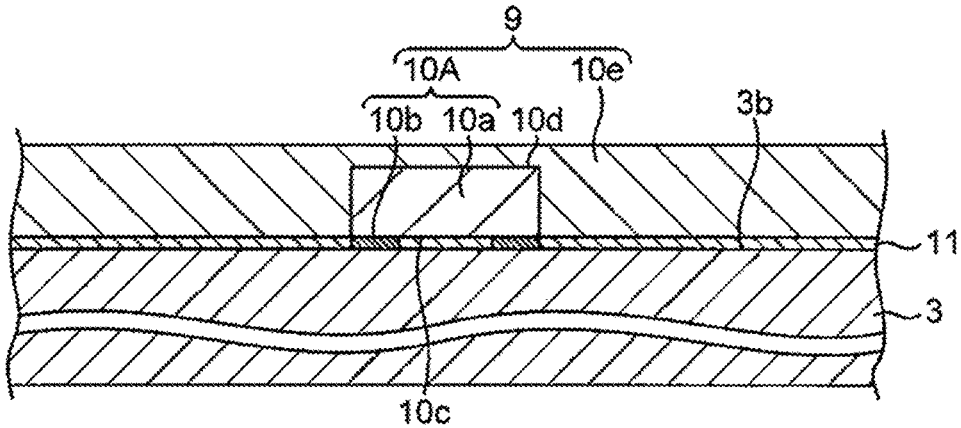
FIG. 6D is an explanatory view for explaining a method for manufacturing a composite component.
Figure 6E:
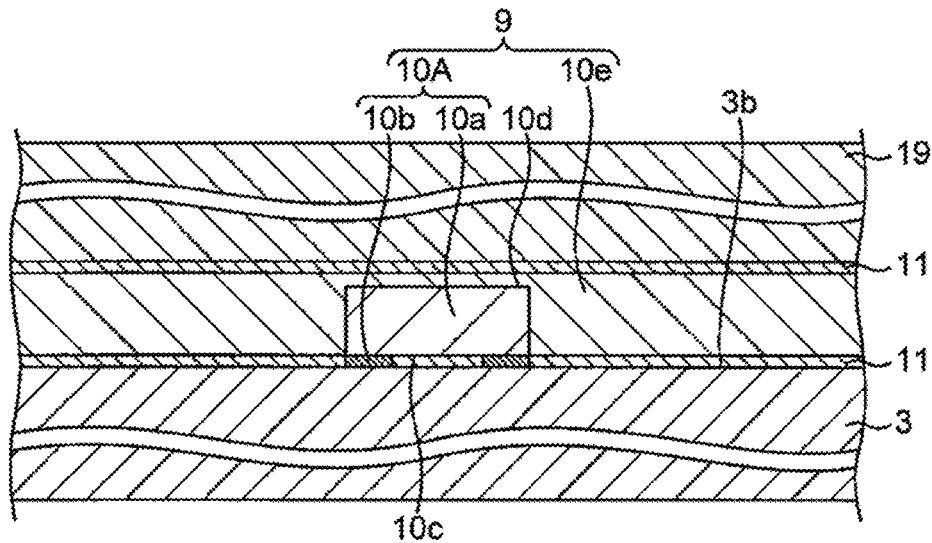
FIG. 6E is an explanatory view for explaining a method for manufacturing a composite component.
Figure 6F:
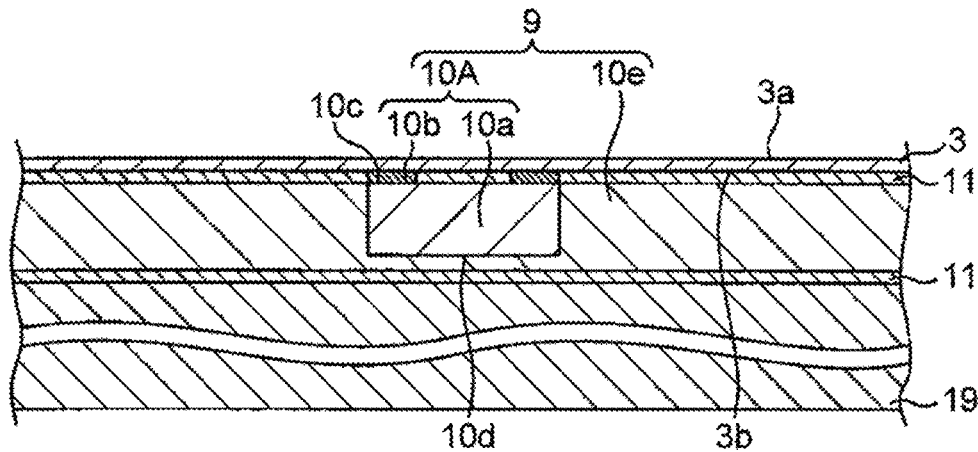
FIG. 6F is an explanatory view for explaining a method for manufacturing a composite component.
Figure 6G:
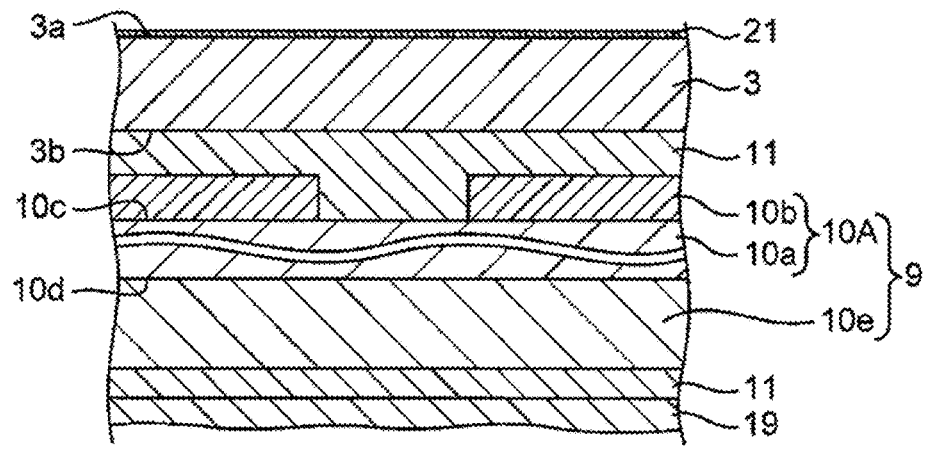
FIG. 6G is an explanatory view for explaining a method for manufacturing a composite component.
Figure 6H:
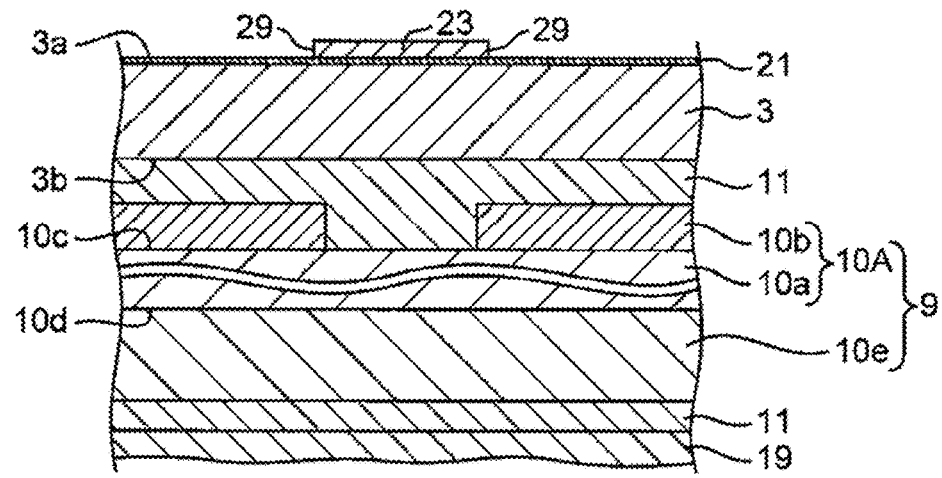
FIG. 6H is an explanatory view for explaining a method for manufacturing a composite component.
Figure 6I:
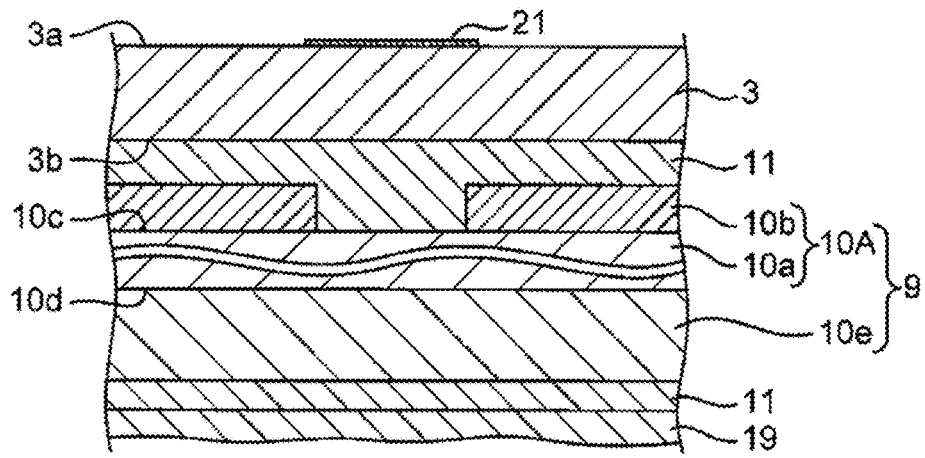
FIG. 6I is an explanatory view for explaining a method for manufacturing a composite component.
Figure 6J:
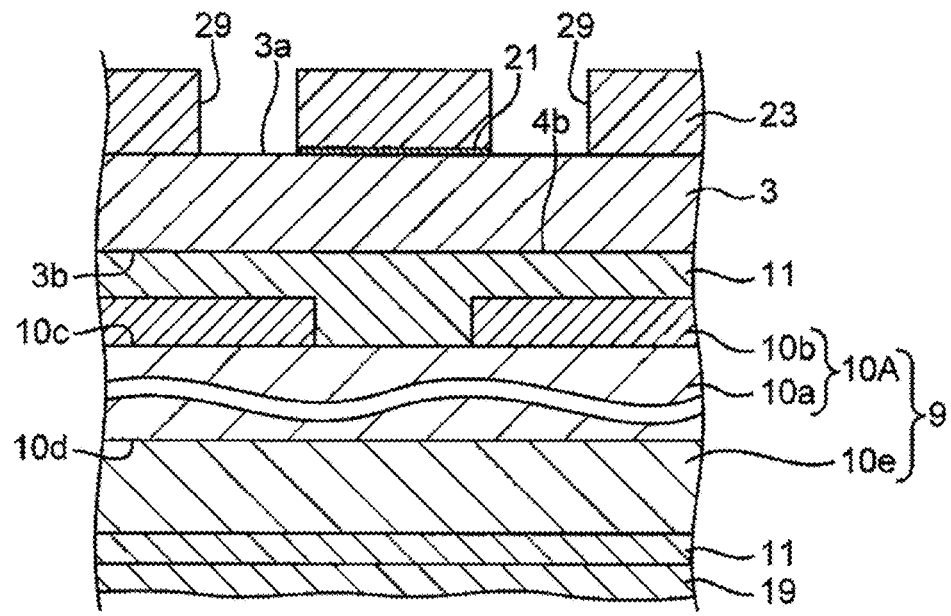
FIG. 6J is an explanatory view for explaining a method for manufacturing a composite component.
Figure 6K:
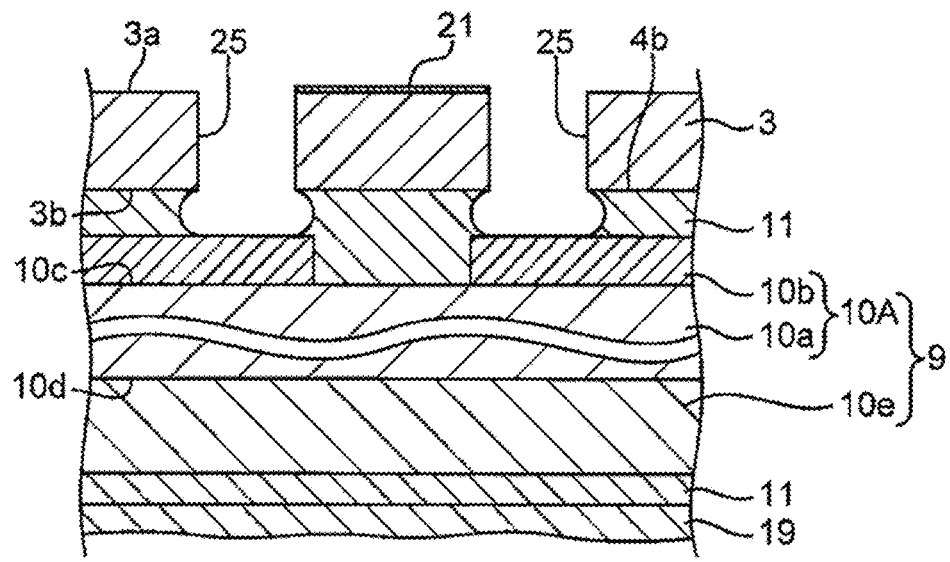
FIG. 6K is an explanatory view for explaining a method for manufacturing a composite component.
Figure 6L:
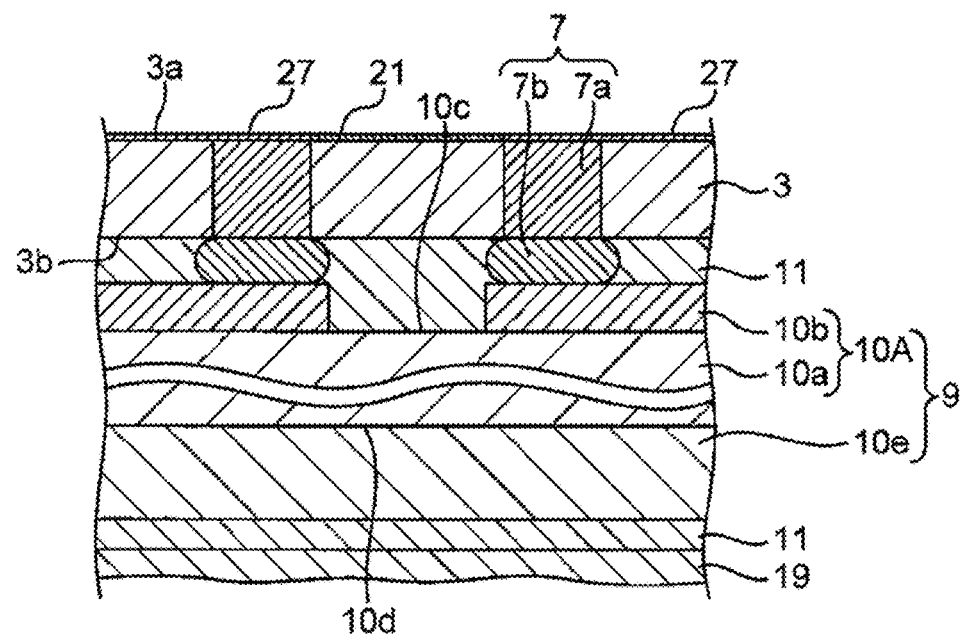
FIG. 6L is an explanatory view for explaining a method for manufacturing a composite component.
Figure 6M:
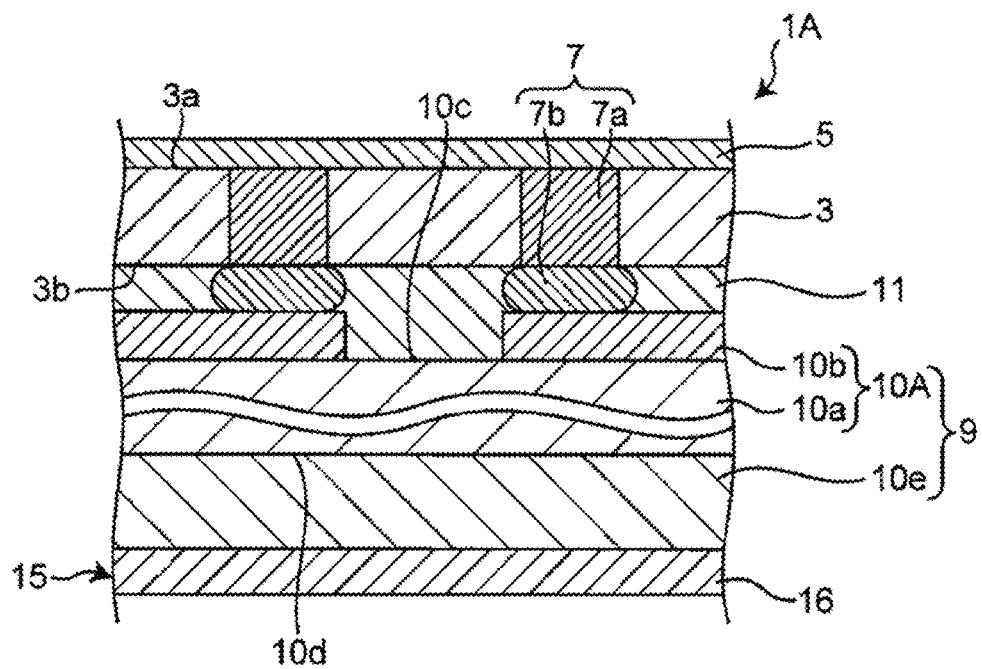
FIG. 6M is an explanatory view for explaining a method for manufacturing a composite component.

In the electronic component layer thinning step, as illustrated in FIG. 6D, the electronic component layer 9 is thinned.

The resin 10e is ground to be thinned and flattened using a back grinder of a Si wafer. The Si support forming step to the rewiring layer forming step illustrated in FIGS. 6E to 6M after the electronic component layer thinning step can be performed in the same manner as in FIGS. 3D to 3L. It should be noted that FIGS. 6G to 6M are enlarged as compared with FIGS. 6A to 6F.

Note that the manufacturing conditions in the first and second embodiments are not limited as long as the through Si vias electrically connected to the component electrodes of the electronic component can be formed.

The present disclosure is not limited to the first and second embodiments, and can be implemented in various aspects as long as the gist of the present disclosure is not changed. In addition, the configurations illustrated in the first and second embodiments are examples and are not particularly limited, and various modifications can be made without substantially departing from the effects of the present disclosure.

For example, the matters described in the first and second embodiments can be appropriately combined. For example, the configuration described in the first embodiment and the configuration described in the second embodiment can be combined.

DESCRIPTION OF REFERENCE SYMBOLS 1, 1A, 101: Composite component
2: Interposer structure
3, 103: Si base layer
3a, 103a: First main surface
3b, 103b: Second main surface
5, 105: Rewiring layer
7, 107: Through Si via
7a: Through Si via main body
7b: Extending portion
9: Electronic component layer
10, 10A, 110: Electronic component
10a: Electronic component main body
10b, 110b: Component electrode
10c: Third main surface
10d: Fourth main surface
10e: Resin
11: Adhesive layer
12: Coating film
15: Interposer electrode layer
16, 116: Interposer electrode
19: Si Support
21: Dielectric film
23: Photoresist film
25: Through hole
27: Wiring
29: Cavity
102: Interposer structure
111: Solder bump

The invention claimed is:

1. A composite component comprising:
an interposer structure that includes:
  a Si base layer having a first main surface and a second main surface facing each other,
  a rewiring layer on the first main surface,
  a through Si via electrically connected to the rewiring layer and penetrating the Si base layer,
  an interposer electrode facing the second main surface, and
  an adhesive layer; and
an electronic component having a surface and a component electrode on the surface and connected to the through Si via, the electronic component located between the interposer electrode and the Si base layer,
wherein
the component electrode and the surface of the electronic component are adhered to the second main surface of the Si base layer with the adhesive layer interposed therebetween,
the through Si via includes a through Si via main body and an extending portion extending from the second main surface, penetrating the adhesive layer, and electrically connected to the component electrode, and wherein, a sectional shape of the component electrode in a plane orthogonal to a stacking direction of the composite component is substantially rectangular, a sectional shape of the through Si via in the plane is substantially circular, and a diameter φ of the through Si via satisfies:

$$T(Si)+(T(A)-H(C))/3 \leq \varphi \leq r,$$

wherein T(Si) is a thickness of the Si base layer, T(A) is a thickness of the adhesive layer, H(C) is a height of the component electrode, and r is a diameter of a circle inscribed in the sectional shape of the component electrode at an interface between the through Si via and the component electrode.

2. The composite component according to claim 1, wherein only the through Si via electrically connects the component electrode to the rewiring layer.

3. The composite component according to claim 2, wherein a length of the Si via is 3 μm to 46 μm.

4. The composite component according to claim 1, further comprising:

a conductive pillar that electrically connects the through Si via and the component electrode, the conductive pillar including a conductive material which is the same as a conductive material of the through Si via.

5. The composite component according to claim 1, wherein the adhesive layer has a thickness of 26 μm or less.

6. The composite component according to claim 1, wherein two or more of the through Si vias are electrically connected to the component electrode.

7. The composite component according to claim 1, further comprising:

a resin that seals and integrates the electronic component.

8. The composite component according to claim 7, wherein the resin is an epoxy resin, and the resin further contains a $SiO_2$ filler dispersed in the resin.

9. The composite component according to claim 1, further comprising:

a first insulating film between the through Si via and the Si base layer; and a second insulating film between the adhesive layer and the Si base layer, and a thickness of the second insulating film is less than a thickness of the first insulating film.

10. The composite component according to claim 1, wherein a maximum diameter of the extending portion is larger than a minimum diameter of the through Si via main body.

11. The composite component according to claim 1, wherein a maximum diameter of the extending portion is larger than a maximum diameter of the through Si via main body.

* * * * *